(12) United States Patent
Lautzenhiser

(10) Patent No.: US 6,417,738 B1
(45) Date of Patent: Jul. 9, 2002

(54) ADAPTIVE FREQUENCY-HOPPING OSCILLATORS

(75) Inventor: Lloyd L. Lautzenhiser, Nobel (CA)

(73) Assignee: Emhiser Research Limited, Parry Sound (CA)

( * ) Notice: Subject to any disclaimer, the term of this patent is extended or adjusted under 35 U.S.C. 154(b) by 0 days.

(21) Appl. No.: 09/353,406

(22) Filed: Jul. 15, 1999

Related U.S. Application Data

(63) Continuation-in-part of application No. 09/174,397, filed on Oct. 14, 1998, now abandoned.
(60) Provisional application No. 60/069,077, filed on Dec. 9, 1997, and provisional application No. 60/062,982, filed on Oct. 21, 1997.

(51) Int. Cl.[7] ........................... H03L 7/089; H03L 7/10; H03L 7/18
(52) U.S. Cl. ........................... 331/17; 331/1 A; 331/16; 331/23; 331/25; 327/156; 327/159
(58) Field of Search ................ 331/1 A, 10, 11, 331/16, 17, 23, 25; 327/156–159; 375/370; 455/260

(56) References Cited

U.S. PATENT DOCUMENTS

| | | |
|---|---|---|
| 2,956,272 A | 10/1960 | Cohler et al. |
| 4,410,879 A | 10/1983 | Gumm et al. |
| 4,511,858 A | 4/1985 | Charavit et al. |
| 4,568,888 A | 2/1986 | Kimura et al. |
| 4,810,974 A | 3/1989 | Hulbert et al. |
| 4,980,652 A | 12/1990 | Tarusawa et al. |
| 5,008,676 A | 4/1991 | Kanoh |
| 5,036,295 A | 7/1991 | Kamitani |
| 5,134,398 A | 7/1992 | Yasutake et al. |
| 5,207,491 A | 5/1993 | Rottinghaus |
| 5,220,293 A | 6/1993 | Rogers |
| 5,270,716 A | 12/1993 | Gleim |
| 5,371,425 A | 12/1994 | Rogers |
| 5,389,899 A | 2/1995 | Yahagi et al. |
| 5,408,196 A | 4/1995 | Sempel et al. |
| 5,477,194 A | 12/1995 | Nagakura |
| 5,604,465 A | 2/1997 | Farabaugh |
| 5,748,128 A | 5/1998 | Bruccoleri et al. |
| 5,757,238 A | 5/1998 | Ferraiolo et al. |

*Primary Examiner*—David Mis
(74) *Attorney, Agent, or Firm*—Wendell E. Miller

(57) ABSTRACT

A frequency-hopping oscillator (72, 136, 170, or 190) includes a phase-locked oscillator (74, 152, 172, or 196). The phase-locked oscillator (74, 152, 172, or 196) includes both a digital integrator (82 or 146) and a lead compensator (84, 148, or 180), and uses either analog (108) or digital (184) summation of integration and lead-compensation signals to provide a lead-compensated digital integrator (86, 150, or 182). The frequency-hopping oscillator (72, 136, 170, or 190) is adaptive in that it develops channelizing voltage via analog components, such as a VCO 20 and an improved D/A converter 98. The improved D/A converter 98 is designed to prevent "holes" even if a larger number of bits are processed using low-precision resistors. The improved D/A converter 98 is further characterized as being nonlinear (286), producing a lower output voltage (280) by a higher bit than by a total output voltage (278) produced by all lower bits, and producing an output voltage by one bit that is less than twice the output voltage of the next lower bit.

67 Claims, 8 Drawing Sheets

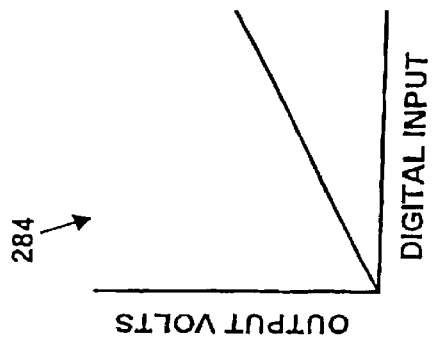
FIG. 14
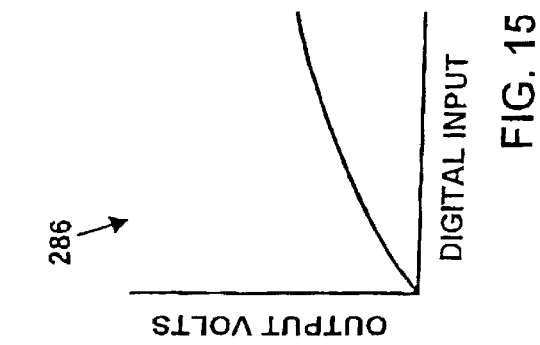
FIG. 15
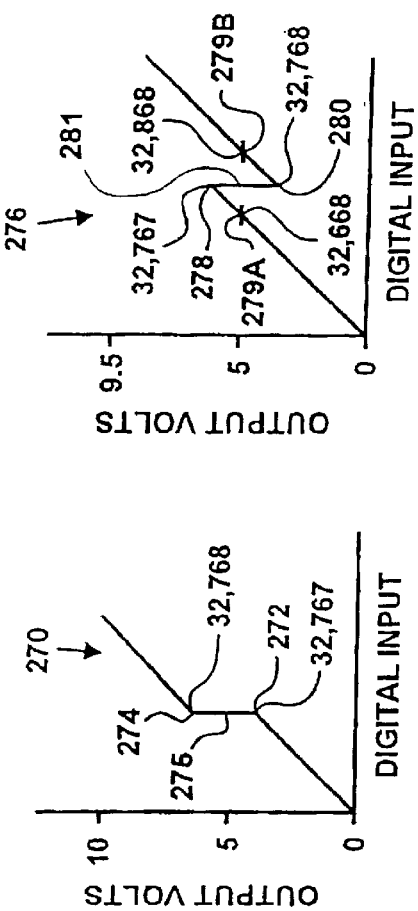
FIG. 12A
FIG. 12B
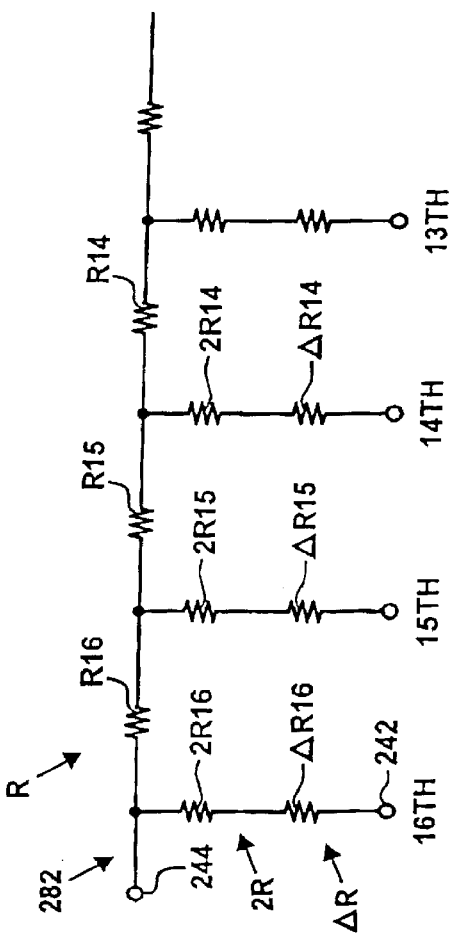
FIG. 13

ADAPTIVE FREQUENCY-HOPPING OSCILLATORS

CROSS-REFERENCE TO RELATED APPLICATION

This application is a Continuation-in-part of U.S. patent application Ser. No. 09/174,397, filed Oct. 14, 1998 now abandoned which claims the benefit of U.S. Provisional application Ser. No. 60/062,982, filed Oct. 21, 1997, and U.S. Provisional application Ser. No. 60/069,077, filed Dec. 9, 1997.

STATEMENT RE FEDERALLY SPONSORED RESEARCH OR DEVELOPMENT

Not Applicable

REFERENCE TO A "MICROFICHE INDEX"

Not Applicable

BACKGROUND OF THE INVENTION

1. Field of the Invention

The present invention relates generally to adaptive frequency-hopping oscillators and phase-locked oscillators. More particularly, the present invention pertains to phase-locked oscillators with adaptive circuitry, to lead-compensated digital integrators for use in phase-locked oscillator, and to nonlinear D/A converters for use in learning systems such as adaptive frequency-hopping oscillators.

2. Description of the Related Art

Frequency-hopping transmitters are capable of transmitting radio frequencies on successive ones of a plurality of individual output frequencies with the output frequencies chosen in accordance with a code for a particular day or period.

Since the transmitted information remains on a given frequency for a matter of seconds, or microseconds, and since the order of selection of frequencies can be changed rapidly and precisely, information can be successfully encoded by the use of frequency-hopping transmitters.

As an example, when used to transmit video signals, a frequency-hopping transmitter could transmit each successive scan line at a different frequency.

The individual output frequencies are called channels, and the process of dividing a range of frequencies into channels is called channelizing. Each channelized frequency is produced by applying a selective voltage to a voltage controlled oscillator, and the selective voltages that will drive the voltage controlled oscillator to the channelized frequencies are called channelizing voltages.

Frequency-hopping oscillators can be designed to learn channelizing voltages for a particular voltage controlled oscillator, to correct for errors of proportionality and non-linearity of analog components, and to correct for temperature-caused drift of analog components. Learning systems are sometimes called adaptive systems or adaptive learning systems.

Charavit et al., in U.S. Pat. No. 4,511,858, issued Apr. 16, 1985, teaches embodiments of phase-locked oscillators that use analog integrators. Their phase-locked oscillators are adaptive in that channelizing voltages are stored, recalled, corrected through a phase-locked loop, and placed again in storage.

A frequency-hopping transmitter is a transmitter that utilizes a frequency-hopping oscillator. In like manner, a frequency-hopping receiver is a receiver that utilizes a frequency-hopping oscillator. A frequency-hopping oscillator is a phase-locked oscillator that is channelized and whose channelized frequencies can be accessed rapidly in response to a predetermined program.

Phase-locked oscillators are used in transmitters for producing an output frequency that is crystal referenced, for demodulating frequency modulated signals in radio receivers, to achieve frequency deviation compression in frequency-modulated and phase-modulated receivers, and in various devices in which both rapid change to selected frequencies and precise frequency control are critical.

The use of phase-locked oscillators to achieve frequency deviation compression in radio receivers is taught by Lautzenhiser in U.S. Pat. No. 5,091,706, issued Feb. 25, 1992; in U.S. Pat. No. 5,497,509, issued Mar. 5, 1996; and in U.S. Pat. No. 5,802,462, issued Sep. 1, 1998.

Phase-locked oscillators can be AC modulated, DC modulated, or both, as taught by Lautzenhiser in U.S. Pat. No. 5,091,706; in U.S. Pat. No. 5,097,230, issued Mar. 17, 1992; and in U.S. Pat. No. 5,311,152, issued May 10, 1994. In addition, phase-locked oscillators can be channelized as also taught by the aforesaid Lautzenhiser patents. Frequency-hopping oscillators may be AC and/or DC modulated using principles taught in the aforesaid Lautzenhiser patents.

A phase-locked oscillator includes both a forward path and a feedback path. As defined herein, the forward path extends from a comparing device, or phase detector, through a VCO, to an output frequency conductor. The feedback path extends from the output frequency conductor, through one or more frequency dividers which serve as channelizing devices and/or other devices in the feedback path, to the comparing device. In accordance with these definitions, the comparing device is not a part of either path.

In phase-locking oscillators, both the forward path and the feedback path are connected to a crystal-controlled reference oscillator by a comparing device. Phase lock is achieved when a feedback frequency from a voltage controlled oscillator equals the frequency of the reference oscillator.

Channelization of phase-locking oscillators is achieved by channelizing the feedback path. The feedback path is channelized by dividing frequencies in the feedback path by N, as shown herein, by any of the ways taught by Lautzenhiser in the aforesaid patents, by partial N manipulation, or by nearly any other method that is conceivable.

Since channelization of the feedback path is dependent only upon the time required to divide the frequency in the feedback path by a different number, if a channelization voltage is simultaneously applied to the VCO, channelization is extremely rapid.

AC modulation of the forward path, at frequencies above the loop frequency, may be achieved by applying an analog voltage, or modulating voltage, to the VCO via a modulation resistor, as taught in the aforesaid Lautzenhiser patents, or by any other suitable means.

DC modulation of the feedback path may be achieved by digital manipulation of pulses in the feedback path, as taught by Lautzenhiser in the aforesaid patents, or by any other suitable means.

In phase-locked oscillators, an error signal is produced by a difference in a feedback frequency to a reference frequency. This error signal may be integrated by analog or digital circuitry.

In phase-locked oscillators that use an analog integrator, the error signal is time-integrated. This time-integrated error signal, which is a voltage, is applied to the VCO during the integration process. The error signal disappears and integration stops when phase lock is achieved.

In phase-locked oscillators that use a digital integrator, the error signal is integrated by summing clock-timed UP and DOWN error signals. D/A conversion changes the digitally-integrated error signals into voltage which is applied to the VCO during the integration process. Error signals disappear and integration stops when phase lock is achieved.

BRIEF SUMMARY OF THE INVENTION

The frequency-hopping oscillators of the present invention include adaptive circuitry with learning and recalling functions, thereby providing frequency-hopping oscillators in which an output frequency of a VCO can be channelized without waiting for phase locking.

Channelizing information, and/or frequency-correction information, is developed and stored that, when recalled will drive the output frequency to the desired channel almost instantly, and with very little deviation from frequencies that would phase lock for the respective channels.

The channelizing information compensates for errors in proportionality and linearity of such components as a D/A converter, an analog combiner/offsetter, resistor values, and/ or a VCO. Subsequent return to the same channelized frequency results in automatic correction for temperature drift of various components that may have occurred since the channel was last accessed.

That is, adaptive circuitry stores channelizing information that can be recalled and converted into a plurality of channelization voltages, one for each channel. Thereafter, the output frequency of the VCO can be driven to channelized frequencies that approach phase lock without waiting for the phase-locked oscillator to phase lock.

The various embodiments include digital integrators and special circuitry that mimics analog circuitry. That is, they each include circuity that provides digital lead compensation, thereby providing loop stability for the digital integrators, even as analog integrators use a lead resistor in series with an integrating capacitor to achieve lead compensation and loop stability.

In first and second embodiments, lead compensation is achieved by analog summation of a channelizing voltage and a lead compensating voltage. In a third embodiment, lead compensation is achieved by digital summation of digitized channeling information and a digital lead-compensation signal.

If a battery back-up is provided in any of the embodiments, at initialization, as each channel is accessed and the frequency-hopping oscillator phase locks to each channelized frequency, the frequency-hopping oscillator learns its channelizing voltage, and the channelizing information that represents each channelizing voltage, is stored in digital form.

If battery retention of volatile memory is not included, upon start-up, as each channel is accessed, the frequency-hopping oscillator phase locks to the respective frequencies. And the RAM stores the channelizing information.

When the channelizing information is recalled from memory and converted to a channelizing voltage, the output frequency of the VCO will be driven to a frequency that will phase lock except for temperature drift of components since last accessing the same channel.

In addition to lead-compensated digital integrators, the present invention includes improved D/A converters.

Whereas the primary design objective of prior-art D/A converters has been to produce output voltages that increase linearly in response to increased digital inputs, the improved D/A of the present invention produces analog outputs that are intentionally nonlinear.

That is, whereas prior art D/A converters provide analog outputs in which each higher bit produces a voltage that is twice as high as the next lower bit, the D/A converter of the present invention can be characterized as having an analog output of a higher bit that is less than twice the analog output of the next lower bit.

The improved D/A converter of the present invention also can be characterized as having an analog output of the highest bit that is less than the sum of the outputs of all lower bits.

Further, the improved D/A of the present invention can be characterized as having dual addresses. A D/A converter has dual addresses if the same analog output can be produced in response to two different digital inputs.

Still further, the improved D/A converter of the present invention can be characterized as being without "holes." A D/A converter is said to have holes if one digital input produces an analog output that is too low to satisfy a need, such as phase locking, and the next higher digital input produces an analog output that is too high to satisfy a need, such as phase locking. For instance, if an increase in a digital input of 1 produced a voltage step significantly higher than an average, or nominal, voltage step, the hole would reduce the effective resolution of the D/A converter by one bit.

Holes are caused by accumulative errors in resistances in D/A converters. While twelve bit D/A converters are practical and relatively economical, it is difficult and expensive to prevent holes in larger D/A converters because of the large number of resistor tolerances and random accumulation of the resistor tolerances.

Therefore, the present invention provides a nonlinear D/A converter that excels over prior-art D/A converters in both performance and cost when used in adaptive systems such as taught herein.

More particularly, the nonlinear D/A converter of the present invention prevents holes in output voltages, allows lower cost resistors to be used, and allows a larger number of bits to be processed, even when low cost resistors are used.

In a second aspect of the present invention, a method for adaptively producing channelizing information for a plurality of channelized output frequencies comprises: selecting phase-locking parameters for one of the channelized frequencies; producing UP/DOWN signals indicative of phase-locking conditions; digitally integrating the UP/DOWN signals at a clock frequency; and the digital integrating step comprises recalling and digitally storing at the clock frequency.

In a third aspect of the present invention, a method for adaptively producing channelizing information for a plurality of channelized output frequencies comprises: selecting phase-locking parameters for one of the channelized frequencies; producing UP/DOWN signals indicative of phase locking conditions; accumulatively-summing correction signals as a function of the UP/DOWN signals; and the accumulatively summing step comprises repeatedly storing and recalling at a clock frequency.

In a fourth aspect of the present invention, in apparatus for adaptively producing channelizing information for a plurality of channelized output frequencies comprises a phase-locked oscillator having a phase detector, having a forward path that is operatively connected to the phase detector, and having both an integrator and a voltage-controlled oscillator in the forward path, the improvement in which the integrator comprises: a digital storage device; a parallel adder being operatively connected to the digital storage device; and means, comprising the digital storage device and the parallel adder, for summing successive ones of plus one, minus one, or zero correction signals at a clock frequency.

In a fifth aspect of the present invention, in apparatus for adaptively producing channelizing information for a plurality of channelized output frequencies comprises a phase-locked oscillator having an integrator in a forward path, the improvement in which the integrator comprises: means for algebraically-summing successive ones of plus one, minus one, or zero correction signals at a clock frequency; and the means for algebraically summing comprises means for storing and recalling the algebraically-summed correction signals at the clock frequency.

In a sixth aspect of the present invention, in apparatus for adaptively producing channelizing information for a plurality of channelized output frequencies comprises a phase-locked oscillator having a phase comparator that produces UP/DOWN signals indicative of phase-locking conditions, and having a forward path with a voltage-controlled oscillator that produces an output frequency, the improvement which comprises: means, being interposed intermediate of the phase detector and the voltage-controlled oscillator, for recalling and storing digital information at a clock frequency; and means for adding successive ones of a plus one, a minus one, or a zero to the recalled information in accordance with the UP/DOWN signals intermediate of the recalling and storing.

In a seventh aspect of the present invention, in apparatus for adaptively producing channelizing information for a plurality of channelized output frequencies comprises a phase-locked oscillator having a phase comparator, and having a forward path with a voltage-controlled oscillator that produces an output frequency, the improvement which comprises: a digital storage device being operatively interposed intermediate of the phase comparator and the forward path; and a parallel adder being operatively interposed intermediate of the comparator and the forward path, and being operatively connected to the digital storage device; and a clock, being operatively connected to the digital storage device.

In an eighth aspect of the present invention, a method for adaptively producing channelizing information for a plurality of channelized frequencies comprises: recalling previously-stored digital information for one of the channelized frequencies; adaptively correcting the recalled digital information; storing the corrected digital information; and repeating the recalling, adaptively correcting, and storing steps at a clock frequency.

In a ninth aspect of the present invention, a method for adaptively producing channelizing information for a plurality of channelized output frequencies, which method comprises: recalling previously-stored channelizing information for the one channelized frequency; driving an output frequency toward phase lock for the one channelized frequency; producing UP/DOWN signals indicative of phase-locking conditions; digitally integrating the UP/DOWN signals; and the digital integrating step comprises repeatedly recalling and storing prior to recalling channelizing information for an other of the channelized frequencies.

In a tenth aspect of the present invention, a method for adaptively producing channelizing information for a plural-ity of channelized output frequencies comprises: selecting phase-locking parameters for one of the channelized frequencies; recalling previously-stored channelizing information for the one channelized frequency; driving an output frequency toward phase lock for the one channelized frequency; accumulatively-summing successive ones of correction signals as a function of phase locking conditions; and the accumulatively summing step comprises repeatedly recalling, algebraically adding, and storing prior to recalling channelizing information for an other one of the channelized frequencies.

In an eleventh aspect of the present invention, in apparatus for adaptively producing channelizing information for a plurality of channelized frequencies comprises a phase-locked oscillator, the improvement which comprises: means for recalling channelizing information for one of the channelized frequencies; means for adaptively correcting the recalled channelizing information for the one channelized frequency; means for storing the adaptively-corrected channelizing information; and means for repeatedly repeating the recalling, adaptively correcting, and storing prior to recalling channelizing information for an other of the channelized frequencies.

BRIEF DESCRIPTION OF THE SEVERAL VIEWS OF THE DRAWINGS

FIG. 12A is a diagram, showing in smoothed curve form, that variations in output voltages of the D/A converter of FIG. 9 may cause holes; FIG. 12B is a diagram, showing in smoothed curve form, that variations in resistances of standard resistors may result in duplicate digital addresses;

FIG. 13 is a schematic drawing of a preferred embodiment of a nonlinear D/A converter for use with channelized phase locking oscillators and frequency-hopping oscillators of the present invention;

FIG. 14 is a diagram showing that voltage output versus digital input for the conventional D/A converter of FIG. 9 is linear;

FIG. 15 is a diagram showing that voltage output versus digital input for the D/A converter of FIG. 13 is nonlinear.

DETAILED DESCRIPTION OF THE INVENTION

Figure 1:
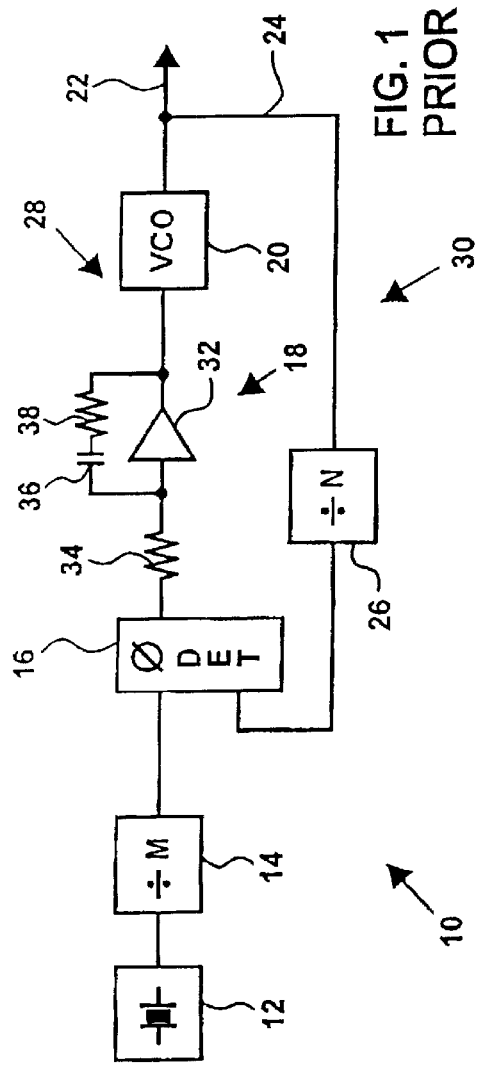
FIG. 1 is a schematic drawing of a prior-art phase-locked loop with an analog integrator.
Figure 2:
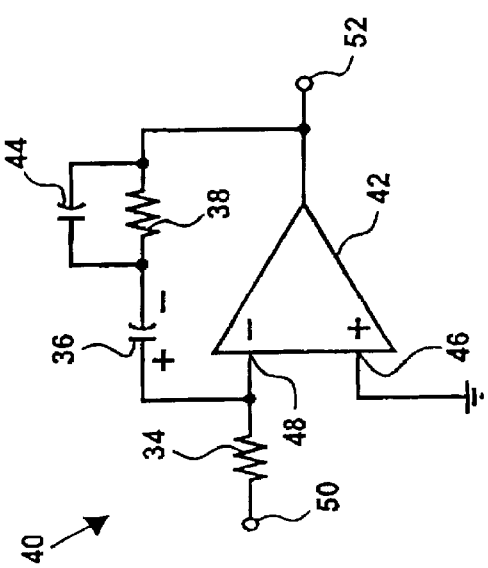
FIG. 2 is a schematic drawing of a prior-art analog integrator for the phase-locked loop, similar to that of FIG. 1, but in more detail.

Referring now to FIGS. 1 and 2, before considering the preferred embodiment of the present invention, a brief review of phase-locked oscillators and integrators may be helpful. Also, it is appropriate to review integrators with lead compensation, since lead compensation is necessary to achieve stability in phase-locked loops.

A prior-art phase-locked oscillator 10 of FIG. 1 includes a reference oscillator, or clock 12, a divider 14 for dividing the reference frequency of the reference oscillator 12 by a constant value of M, a phase comparator, or phase detector, 16, an analog integrator 18, a voltage-controlled oscillator (VCO), or radio-frequency oscillator, 20, an output conductor 22, and a feedback conductor 24. A divider 26 may be included to reduce operating frequencies of the phase detector 16 by dividing by N, or to achieve channelization of frequencies produced by the VCO 20 by dividing by selected values of N.

The phase-locked oscillator 10 also includes both a forward path 28 and a feedback path 30. The forward path 28 extends from the phase detector 16 to the output conductor 22, and the feedback path 30 extends from the output conductor 22 to the phase detector 16. Thus, by definition, the phase detector 16 is in neither the path 28 nor the path 30.

The integrator 18, as shown in FIG. 1, includes an operational amplifier 32, a coupling resistor 34, an integrating capacitor 36, and a lead-compensation resistor 38. However, in actual practice, an analog integrator 40 of FIG. 2 is used that includes a reference-frequency spurious-suppressing capacitor.

That is, the integrator 40 includes an operational amplifier 42, the coupling resistor 34, the integrating capacitor 36, the lead-compensation resistor 38, and a reference-frequency spurious-suppressing capacitor 44.

The operational amplifier 42 of FIG. 2 includes a positive input terminal 46 that is connected to ground, as shown, and a negative input terminal, or inverting input terminal, 48. As shown, the coupling resistor 34 is connected to the negative input terminal 48.

Since the positive input terminal 46 is grounded, the operational amplifier 42 will hold the negative input terminal 48 at virtual ground. Therefore, if a constant positive voltage is applied to an input node 50, a constant current will flow through the coupling resistor 34 that is a function of the constant voltage and the resistance of the resistor 34.

Because of the high input impedance of the operational amplifier 42, there will be negligible current into the negative input terminal, or inverting input terminal, 48. This means that virtually all of the current from the voltage applied to the input node 50 will flow into the capacitor 36 and through the resistor 38. Therefore, the current flow into the capacitor 36 and through the resistor 38 will be equal to the current flow through the resistor 34 until integration is complete.

With a positive voltage at the input node 50, current flow is in a direction from the input node 50, to the negative input terminal 48, through the capacitor 36, and through the resistor 38 to an output node 52. Thus, positive and negative sides of the capacitor 36 are as shown for a positive input voltage at the node 50, and the integrator 40 ramps a voltage negatively between the capacitor 36 and the resistor 38.

Because of the aforementioned current flow through the resistor 38, and the voltage drop across the resistor 38, a voltage is produced at the node 52 that is more negative than the negatively ramped voltage that is produced by the capacitor 36. This additional negative voltage provides lead compensation. Lead compensation is required for stability of phase-locked oscillators, such as the phase-locked oscillator 10 of FIG. 1.

The fact that lead compensation is required for stability of phase-locked loops is attested to by P.V. Brennan in *Phase-Locked Loops, Principles and Practice*, McGraw-Hill, 1996 in section 3.2, pages 33–37. As taught in CMOS/NMOS, Special Functions Data, Series A, 1984, pages 643, the equation for damping is: $\zeta=(\bar{\omega} \times R \times C)/2$, where R is the resistance of the lead-compensation resistor 38, and C is the capacity of the integrating capacitor 36. As seen by this formula, when R goes to zero, damping goes to zero which means that the phase-locked oscillator 10 becomes unstable.

Figure 3:
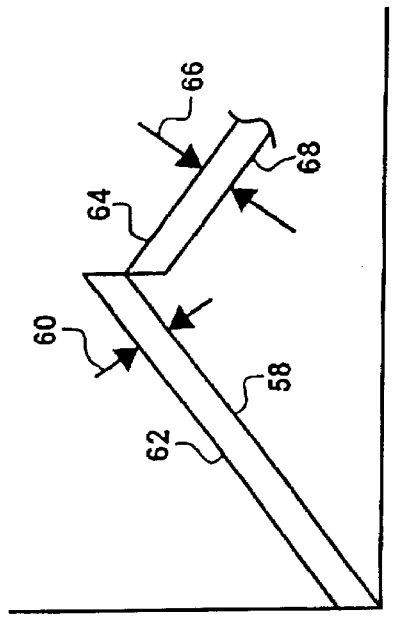
FIG. 3 is a graph of an integrated signal, showing lead compensation added thereto.
Figure 4:
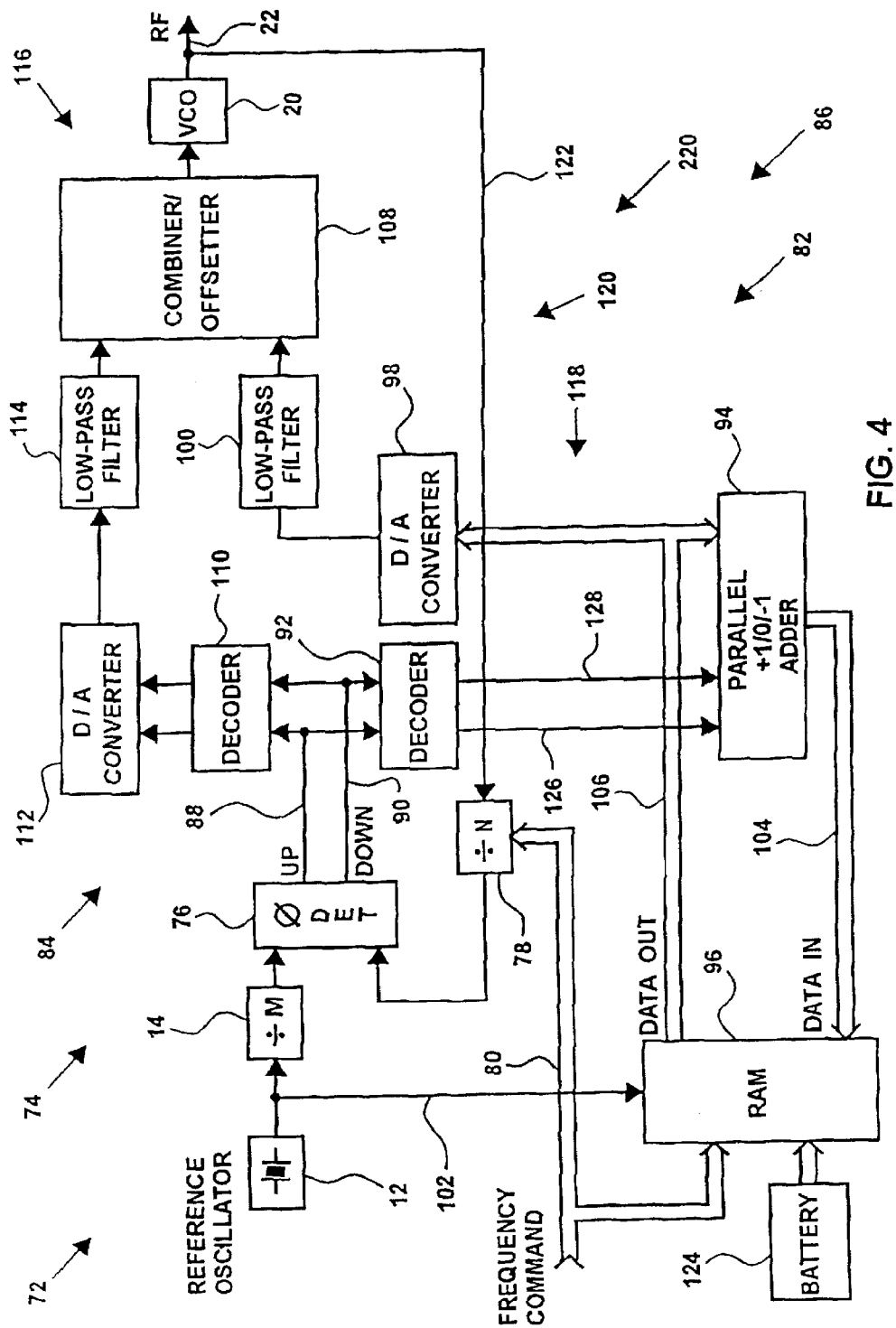
FIG. 4 is a schematic drawing of a preferred embodiment of the present invention in which an adaptive frequency-hopping oscillator utilizes digital integration, and digital lead compensation is added by analog summing.
Figure 6:
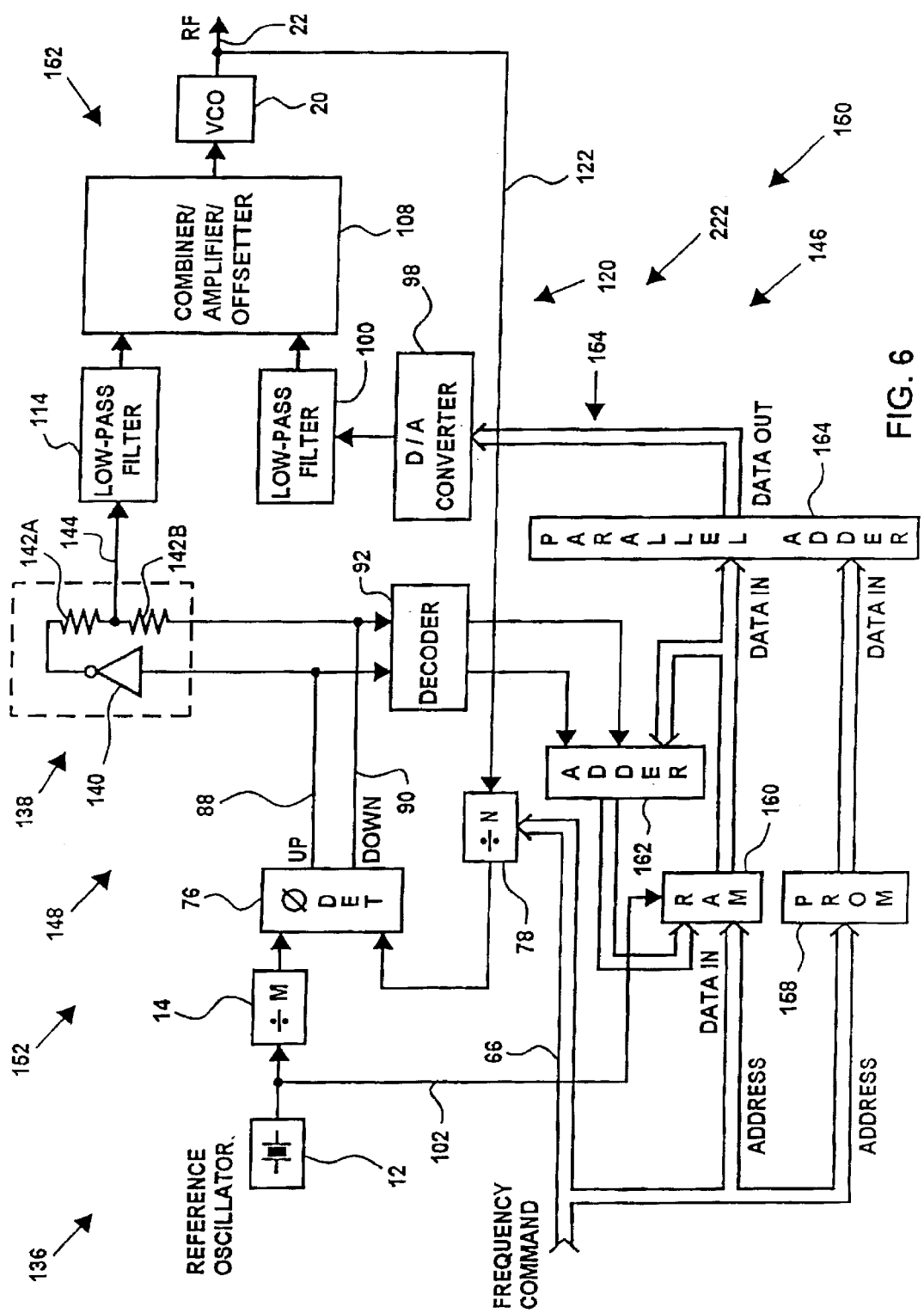
FIG. 6 is a schematic drawing of an embodiment of the present invention in which an adaptive frequency-hopping oscillator utilizes digital integration, digital lead compensation is added by analog summing, and a PROM is used to provide initial channelizing voltages.
Figure 7:
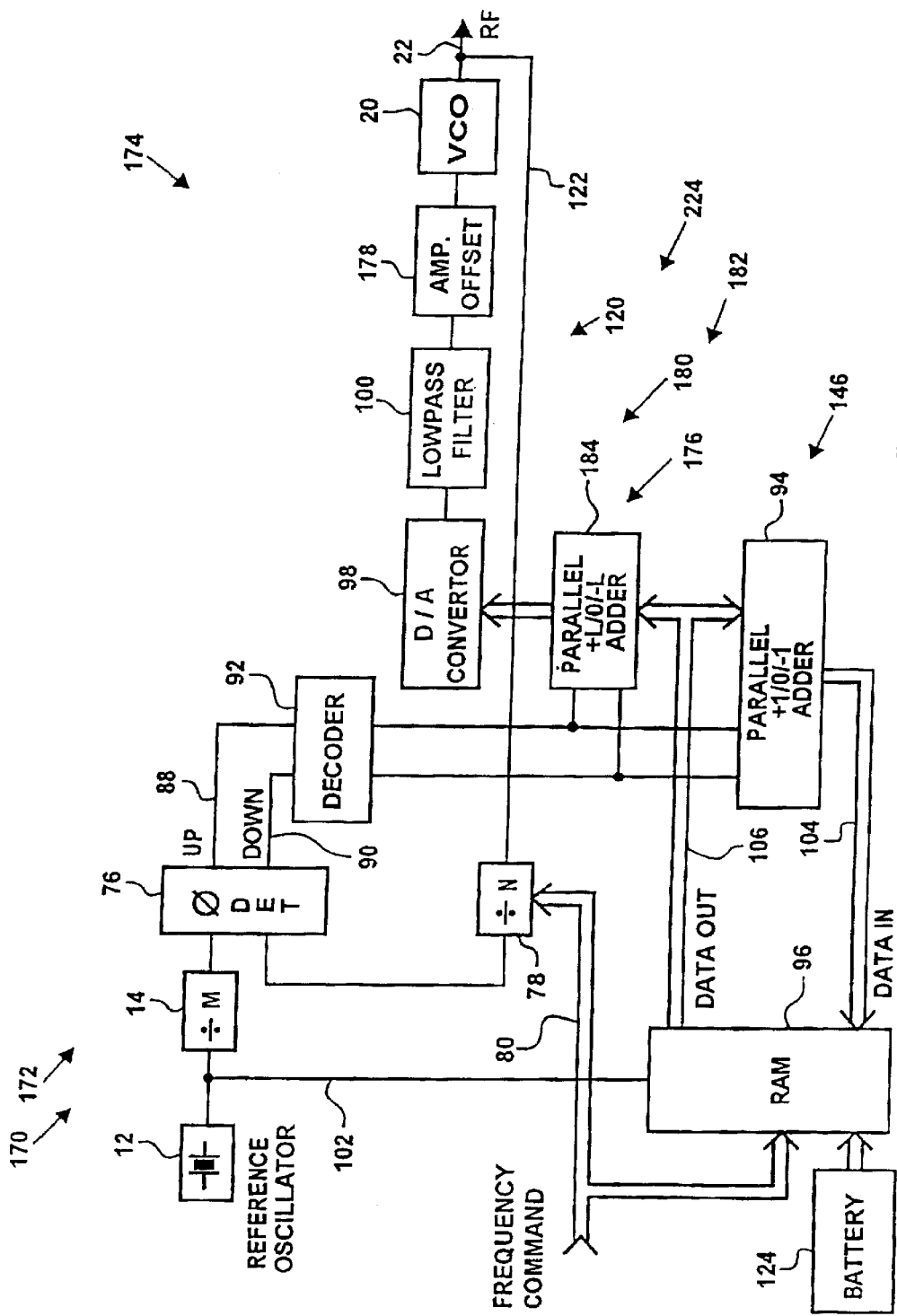
FIG. 7 is a schematic drawing of an embodiment of the present invention in which an adaptive frequency-hopping oscillator utilizes digital integration, and lead compensation is added by digital summation of integration and lead-compensation signals, rather than the analog summation of FIGS. 4 and 6.

In the embodiments of FIGS. 4, 6, and 7 digital integrators are provided with lead compensators that mimic the lead-compensation resistor 38 of FIGS. 1 and 2. A graph of FIG. 3 will be helpful in understanding the digital lead compensators of FIGS. 4, 6, and 7.

Referring now to FIG. 3, an increasing integrator output 58 is accompanied by a lead-compensation signal 60, thereby providing a lead-compensated output 62 that is more positive than the increasing integrator output 58 by a constant and predetermined magnitude. In like manner, a decreasing integrator output 64 is accompanied by a lead-compensation signal 66, thereby providing a lead-compensated output 68 that is more negative than the decreasing integrator output 64 by a constant and predetermined magnitude.

As the increased integrator output 58 of FIG. 3 increases an output frequency in the output frequency conductor 22 of FIG. 1 moves toward phase lock with the reference oscillator 12.

Referring now to FIG. 4, before reciting the structure and operation in detail, a brief preview will be presented. This overview should not only be clearly understandable, but should also make the detailed description easier to understand.

An adaptive frequency-hopping oscillator, or adaptive system, or learning system, 72 includes a phase-locked oscillator 74. The phase locked oscillator 74 includes the reference oscillator 12, the divider 14, a phase comparator, or phase detector 76, the VCO 20, the output conductor 22, and a divider 78 in which N is controllable digitally by a command signal in a command bus, or bundle of frequency-command conductors, 80.

Assuming that one channelized frequency has been selected for the first time by the frequency-command conductors 80, channelizing information for this one channelized frequency is digitally integrated from frequency-correction information produced by the phase detector 76. As will be described in detail subsequently, frequency-correction information is produced by phase detecting, decoding, and parallel adding/subtracting.

This frequency-correction information continues to increase, and be digitally stored, until it becomes channelizing information, so that, when the digitally-stored channelizing information is D/A converted into a channelizing voltage, it will drive the VCO 20 to an output frequency that approximately phase locks to the reference oscillator 12.

Although the channelizing information for this one channelized frequency is developed and stored in digital form during the learning process, it proceeds to the VCO 20 through D/A and analog components that produce errors. Therefore, when phase lock occurs, the channelizing information has been compensated for analog errors in proportionality and linearity.

Thereafter, when this one channelized frequency is selected and the respective channelizing information is recalled from digital memory and D/A converted into a channelizing voltage, the VCO 20 will be driven to an output frequency that almost equals the output frequency at phase lock.

Further, each time that this same channelized frequency is selected, the channelizing information is updated for any error in output frequency such as temperature drift of analog or D/A components. Error signals are generated by the phase detector 76 at the speed of the reference oscillator 12, so that this updating occurs even if the output frequency remains at one channelized frequency for a very short period of time.

Inclusion of the divider 14 allows increasing a frequency of the reference oscillator 12 in excess of an allowable frequency of operation of the phase detector 76, thereby providing an exceptionally fast sampling rate.

Continuing to refer to FIG. 4, the frequency-hopping oscillator 72 utilizes a digital integrator 82 and a lead compensator, or lead signal means, 84. The digital integrator 82 and the lead compensator 84 provide a lead-compensated digital integrator 86.

However, before discussing the digital integrator 82 and the lead compensator 84 it is important to consider the phase detector 76 in more detail.

The phase detector 76, which, preferably is Motorola part number 45152, has three output states that provide the aforementioned error signals. That is, an output in an UP conductor 88, and an output in a DOWN conductor 90 may separately be either a 1 or a 0, but since the phase detector 76 does not output 0,0, it outputs only three states. That is, the phase detector 76 outputs three different UP/DOWN signals, all of which include both an UP and a DOWN signal.

More particularly, as shown in FIG. 4, the phase detector 76, by phase comparing a feedback frequency, that is equal to an output frequency of the VCO 20 divided by the divider 78, with a reference frequency, that is equal to a frequency of the reference oscillator 12 divided by the divider 14, generates UP/DOWN signals that indicate one of three states.

When the UP conductor 88 of the phase detector 76 produces a 0, and the DOWN conductor 90 produces a 1, these outputs reflect the fact that the frequency produced by the VCO 20 is too low. Conversely, when the UP conductor 88 produces a 1, and the DOWN conductor 90 produces a 0, these outputs reflect the fact that the frequency of the VCO 20 is too high. And when both of the conductors, 88 and 90, produce a 1, the frequency-hopping oscillator 72 is phase locked.

The digital integrator 82 include a pulse decoder 92, a parallel adder 94, and a RAM, or digital storage device, 96. A D/A converter 98 and a low-pass filter 100 convert the digital signal to an analog voltage that is suitable for driving the VCO 20.

In operation, the decoder 92 receives one of the three output states (0,1; 1,0; or 1,1) from the phase detector 76, as noted above, and delivers separate and distinct single-bit outputs to the parallel adder 94. Either one of the two digital outputs will remain constant until the output condition of the phase detector 76 changes to another one of the three output states. A more detailed description of the decoder 92 and the parallel adder 94 will be provided in conjunction with FIG. 5.

The parallel adder 94, which is a sixteen bit device, utilizes the digital outputs of the decoder 92 as sixteen zeros, fifteen zeros followed by a one, or sixteen ones.

Digital integration is achieved as follows: the RAM 96, which is connected to the reference oscillator 12 by a sampling-rate conductor 102, accepts a first sample of the digital output provided by the decoder 92 via the parallel adder 94 and a 16-bit data-in bus 104. This first sample is stored in the RAM 96.

At the frequency of the reference oscillator 12, this first sample is delivered back to the parallel adder 94 via a 16-bit data-out bus 106 to be algebraically summed with a second sample, the algebraic sum of the first and second samples are delivered to the RAM 96 via the data-in bus 104, and this algebraic sum is delivered back to the parallel adder 94 via the data-out bus 106. This cycle repeats at the frequency of the reference oscillator 12 until the frequency-hopping oscillator 72 is in phase lock, or until the frequency command in the command bus 80 is changed.

Simultaneously with the process of digital integration as described above, the progressively and algebraically summed values are delivered to the D/A converter 98 which is capable of processing sixteen bits of information, an analog voltage is outputted by the D/A converter 98 and delivered to the low-pass filter 100, and the filtered analog voltage is applied to the VCO 20 through an analog combiner/offsetter 108 until the frequency-hopping oscillator 72 phase locks.

This process of digital integration is repeated the first time a frequency command in the command bus 80 selects a channelized frequency by changing the value of N, thereby changing the output frequency at which the frequency-hopping oscillator 72 will phase lock. And, each time the frequency-hopping oscillator 72 phase locks to a selected frequency, the digitally-integrated outputs are stored in the RAM 96.

The next time the frequency-hopping oscillator 72 hops to a channelized frequency, the frequency command changes the value of N, and the RAM 96 cooperates with the D/A converter 98 the low-pass filter 100, and the combiner/offsetter 108 to supply a channelizing voltage to the VCO 20, and thereby drive the VCO 20 to an output frequency that approximates phase lock for the selected channelized frequency. This channelizing occurs in less than one microsecond.

It can be seen that the digital values stored in the RAM 96 are the values that, for a given time and temperature, correct for production variations in proportionality, nonlinearities, and temperature drifts of the D/A converter 98, the combiner/offsetter 108, and the VCO 20.

That is, as the RAM 96 digitally integrates a channelizing voltage that will phase lock the system, the RAM-stored digital values are inherently compensated for analog inaccuracies of the D/A converter 98, the combiner/offsetter 108, and the VCO 20. Phase lock is accomplished by applying RAM-accumulated values that keep correcting until phase lock is achieved.

It is important to notice that the stored values will be updated each time a given channelized frequency is produced, unless that channelized frequency is already in phase lock, if the frequency-hopping oscillator 72 remains at that channelized frequency for a period of time that allows the phase detector 76 to provide even one error signal in the conductors, 88 or 90.

For example, if the reference oscillator 12 is producing a reference frequency of 8.0 megahertz, and the divider 14 is dividing by 128, the phase detector 76 will be operating with a reference frequency of 62,500 hertz which is the compare frequency.

In this example, in 125 nanoseconds after receiving either an UP or a DOWN signals from the phase detector 76, the RAM 96 will obtain a sample for algebraic addition to the value previously stored in the RAM 96 for that given channelized frequency.

For example, if the reference oscillator 12 is producing a reference frequency of 8.0 megahertz, and the divider 14 is dividing by 128, the phase detector 76 will be operating with a reference frequency of 62,500 hertz which is the compare frequency.

Continuing to refer to FIG. 3, as previously mentioned, the lead-compensated digital integrator 86 includes the lead compensator 84. And, as also previously mentioned, the lead compensator 84 performs the function of the resistor 38 of FIGS. 1 and 2.

Since the output of a decoder 110 is always of the same sense as the output of the decoder 92, the output of the decoder 110 is a lead-compensating signal. All that remains is to apply this lead-compensating signal to the VCO 20 as a voltage.

That is, an increasing integrator output 58 as shown in FIG. 3, of the digital integrator 82 of FIG. 4, is accompanied by a lead-compensating signal 60, so that a lead-compensated output 62 of FIG. 3 is the sum of both the output of the digital integrator 82 and the lead compensator 84.

In the preferred embodiment of FIG. 4, application of the lead-compensating signal to the VCO 20 is via a D/A converter 112, a low-pass filter 114, and the combiner/offsetter 108.

The combiner/offsetter 108 algebraically adds the lead-compensating signal, as converted to an analog voltage by the D/A converter 112 and filtered by the low-pass filter 114, to the output of the digital integrator 82, as stored in the RAM 96, and as converted to an analog voltage by the D/A converter 98 and filtered by the low-pass filter 100.

As described above, it can be seen that the lead compensator 84 includes the decoder 110, the D/A converter 112, and the combiner/offsetter 108, although only the combiner portion is actually a part of the lead compensator 84.

The combiner/offsetter 108 serves two functions, as named. It functions as an algebraic summer of analog voltages, and it offsets the summed and amplified signal to a voltage that is in the linear tuning range of the VCO 20.

The frequency-hopping oscillator 72 includes a phase-locked loop 116. The phase-locked loop 116 includes both a forward path 118 and a feedback path 120. The forward path 118 extends from the phase detector 76 to the output conductor 22 via the digital integrator 82, the combiner/offsetter 108, and the VCO 20. The feedback path 120 extends from the output conductor 22 to the phase detector 76 via a feedback conductor 122 and the divider 78 and includes both the divider 78 and the feedback conductor 122.

If a backup battery 124 is included at the factory, the frequency-hopping oscillator 72 will learn to compensate for variations in component proportionalities and nonlinearities during burn-in. If the battery 124 is not included, the frequency-hopping oscillator 72 will learn to compensate for variations in component proportionalities and nonlinearities each time the frequency-hopping oscillator 72 is initiated.

In operation, a frequency is selected by a source separate from, and not a part of, the present invention. The command for this frequency is delivered to the RAM 96 via the command bus 80 through which a digitized address representing this selected frequency is transmitted.

As will be described in conjunction with the embodiment of FIG. 6, the decoder 110 and the D/A converter 112 can be replaced by a device that includes only three components: an inverter and two resistors.

Figure 5:
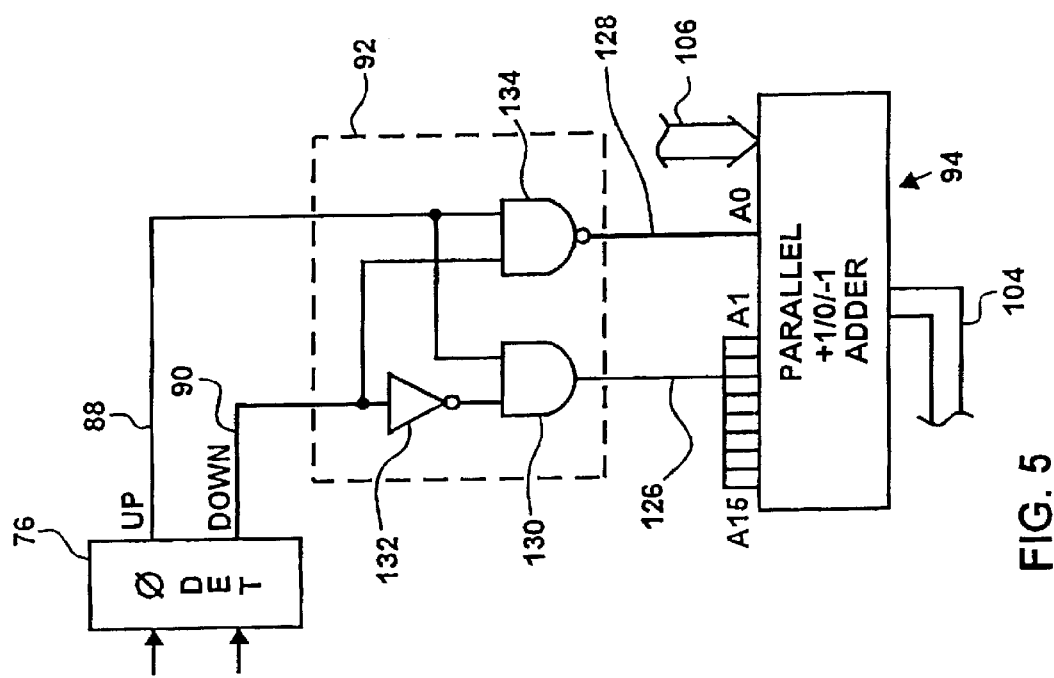
FIG. 5 is a schematic drawing showing details of a decoder that is used in conjunction with the parallel adder in the embodiment of FIG. 4.

For a more complete understanding of the embodiment of FIG. 4, and also of FIGS. 6 and 7, the decoder 92 is shown in FIG. 5 and is described in detail therewith. To more clearly show and describe connections of the decoder 92 of FIG. 5 with FIGS. 4, 6, and 7, conductors 126 and 128 are shown in FIGS. 4–7. The parallel adder 94 is also shown in more detail in FIG. 5. More particularly, the conductor 126 of FIGS. 4 and 5 is shown connected to bits A1 to A15, and the conductor 128 is shown connected to a bit A0.

Referring now to FIG. 5, In operation, 1 is added by the parallel adder 94 when a 1 is supplied to the A0 bit via the conductor 128 and zeros are applied to the bits A1 to A15 via the conductor 126. Since binary subtraction by 1 is accomplished by adding 1 to all bits, 1 is subtracted from the parallel adder when a 1 exists in both conductors, 126 and 128.

Further, since the sampling-rate conductor 102 connects the reference oscillator 12 to the parallel adder 94, the parallel adder 94 continues to add 1 or to subtract 1 at the frequency of the reference oscillator 12.

Continuing to refer to FIG. 5, the decoder 92 includes an AND gate 130, and inverter 132, and a NAND gate 134.

In operation, when an output frequency of the VCO 20 of FIG. 4 is too low, the UP conductor 88 outputs a 0, and the DOWN conductor 90 outputs a 1. The inverter 132 of FIG. 5 inverts its 1 input to a 0, so that both inputs to the AND gate 130 are 0, and the AND gate 130 outputs a 0 to the bits A1–A15 via the conductor 126, since AND gates output a 1 only when both inputs are 1.

At this time, the UP conductor 88 delivers a 0 to the NAND gate 134 and the DOWN conductor 90 delivers a 1 to the NAND gate 134, so that the NAND gate 134 delivers a 1 to the A0 bit via the conductor 128, since NAND gates output a 0 only when both inputs are 1.

With zeros applied to bits A1–A15, and with a 1 applied to bit A0, the parallel adder 94 continues to add ones as long as the UP conductor 88 produces a 0 and the DOWN conductor 90 produces a 1.

When an output frequency of the VCO 20 is too high, the UP conductor 88 produces a 1, the DOWN conductor 90 produces a 0, the NAND gate 134 delivers a 1 to the bit A0, the AND gate 130 delivers a 1 to the bits A0–A15, and the parallel adder 94 subtracts at a rate determined by the reference oscillator 12.

When the phase-locked oscillator 74 of FIG. 4 is in phase lock, the UP conductor 88 produces a 1, the DOWN conductor 90 produces a 1, the NAND gate 134 delivers a 0 to the bit A0, the, inverter 132 and the AND gate 130 cooperate to deliver a 0 to the bits A0–A15, and the parallel adder 94 neither adds nor subtracts.

Referring now to FIG. 6, an adaptive frequency-hopping oscillator, or adaptive system, or learning system, 136 includes components as identified in conjunction with the adaptive frequency-hopping oscillator 72 of FIG. 4, except as included in the following description. One of the differences between the embodiments of FIGS. 4 and 6 resides in apparatus that FIG. 6 uses to achieve lead compensation. This will be described before discussing the adaptive system 136 as a whole.

The adaptive frequency-hopping oscillator 136 of FIG. 6 includes a decoder 138 that replaces both the decoder 110 and the D/A converter 112 of the adaptive frequency-hopping oscillator 72 of FIG. 4. While the decoder 110 and the D/A converter 112 illustrate the necessary functions, the decoder 138 is the actual device that would be used in the embodiments of FIGS. 4 and 6.

The decoder 138 includes an inverter 140 and resistors 142A and 142B. The resistors 142A and 142B have equal resistances.

When phase lock occurs, the phase comparator 76 delivers UP and DOWN signals of 5.0 volts. Since the 5.0 volt UP signal is inverted by the inverter 140, zero volts is applied to the resistor 142A, 5.0 volts is applied to the resistor 142B, and 2.5 volts are delivered to a conductor 144. Therefore, 2.5 volts is the lead-compensating null voltage.

When an output frequency from the VCO 20 is too low to phase lock, the phase comparator 76 delivers an UP signal of zero volts and a DOWN signal of 5.0 volts. Since the zero volt UP signal is inverted by the inverter 140, 5.0 volts are applied to both resistors, 142A and 142B, 5.0 volts is delivered to the conductor 144 that is connected between the resistors, 142A and 142B, and a lead-compensation voltage of 5.0 volts, which is 2.5 volts greater than null, is delivered to the VCO 20 via the combiner/offsetter 108. The lead compensation voltage delivered to the VCO 20 may 5.0 volts, or as proportioned in the combiner/offsetter 108.

When an output frequency from the VCO 20 is too low to phase lock, the phase comparator 76 delivers an UP signal of zero volts and a DOWN signal of 5.0 volts. Since the zero volt UP signal is inverted by the inverter 140, 5.0 volts are applied to both resistors, 142A and 142B, 5.0 volts is delivered to the conductor 144 that is connected between the resistors, 142A and 142B, and a lead-compensation voltage of 5.0 volts, which is 2.5 volts greater than null, is delivered to the VCO 20 via the combiner/offsetter 108. The lead-compensation voltage delivered to the VCO 20 may be 5.0 volts, or as proportioned in the combiner/offsetter 108. lead-compensation voltage of zero volts, which is 2.5 volts lower than null, is applied to the VCO 20.

Since the same UP and DOWN signals are delivered to the decoder 92, which is a part of a digital integrator 146, when the digital integrator 146 is counting upwardly and the D/A converter 98 is producing an ever-increasing voltage, the decoder 138 produces its highest lead-compensating voltage.

In like manner, when the digital integrator 146 is counting downwardly, the decoder 138 supplies zero volts to the combiner/offsetter 108. Since zero volts is lower by 2.5 volts than the lead-compensating null voltage of 2.5 volts, the combiner/offsetter 108 reduces the voltage applied to the VCO 20 by the D/A converter 98. Thus as described here, and as shown in FIG. 3, lead compensation is always in the same direction as integration.

The decoder 138 cooperates with the combiner/offsetter 108 to provide a lead compensator 148, and the lead compensator 148 cooperates with the digital integrator 146 to provide a lead-compensated digital integrator 150. The lead-compensated digital integrator 150 is part of a phase-locked oscillator 152, and the phase-locked oscillator 152 is a part of the adaptive frequency-hopping oscillator 136. The phase-locked oscillator includes a forward path 154 and the feedback path 120. Identification of components included in the paths, 154 and 120, can be made by comparing the embodiments of FIGS. 4 and 6.

A PROM, or digital storage device, 158 is preloaded with channelizing information such that when this channelizing information is converted to an analog channelizing voltage via the D/A converter 98, the output frequency of the frequency-hopping oscillator 20 will be near phase lock.

The channelizing information that is preloaded into the PROM 158 may be values that will produce output frequencies having nominal, or handbook, performance characteristics, but that will produce output frequencies that vary in accordance with actual variations in proportionality and linearity of the D/A converter 98, the combiner/offsetter 108, and the VCO 20. Even though the values of the channelizing information that are burned into the PROM 158 are only average values, several seconds is saved in achieving phase lock at start-up.

If the PROM 158 is of the electrically-erasable type, the PROM 158 may be manually programmed, starting from an average value, to produce a zero output from a RAM, or digital storage device, 160, thereby programming the PROM 158 in accordance with actual system performance. Or, if the RAM 160 includes sixteen bits or more, the frequency-hopping oscillator 136 may be run through all channelized frequencies, and then the phase-locking values of the channelizing information that developed in the RAM 160 may be duplicated in the PROM 158, thereby extending the adaptive characteristics of the frequency-hopping oscillator 136 to the PROM.

Starting with the PROM 158 loaded by any suitable method, such as any of the three described above, if, upon start-up, the VCO 20 is operating at too low an output frequency, for a given channel, to phase lock with the reference oscillator 12, the decoder 92 commands a parallel adder 162 to place digitized frequency-correcting information into the RAM 160. Then the contents of the RAM 160 are added to the digital output of the PROM 158 by a parallel adder 162. The result is an analog channelizing voltage, as produced by the D/A converter 98, driving the VCO 20 to phase lock.

Preferably, the PROM 158 is, at least, a 16-bit device. However, unless the RAM 160 is used to determine the channelizing information that is to be burned into the PROM 158, the RAM 160 may be an 8-bit device. Or, it may include even fewer bits, since it will need to store only frequency-correction information that supplements that of the PROM 158.

While the use of the PROM 158 has been shown and described in conjunction with FIG. 6, which is a variation of the FIG. 4 embodiment, it will be apparent that the same principles may be applied to other embodiments of frequency-hopping oscillators, such as those of FIGS. 4 and 7.

Referring now to FIG. 7, an adaptive frequency-hopping oscillator, or adaptive system, or learning system, 170 includes parts that are like-named and like-numbered with those shown and described in conjunction with FIG. 4. In addition, the adaptive frequency-hopping oscillator 170 includes a phase-locked oscillator 172.

The phase-locked oscillator 172 includes a phase-locked loop 174 with a forward path 176 and the feedback path 120. An amplifier/offsetter 178 is in the forward path 176, as are parts that are like-numbered and like-named with those shown and described in conjunction with FIG. 4.

The phase-locked oscillator 172 also includes the digital integrator 146 of FIG. 4 and a lead compensator 180. The digital integrator 146 and the lead compensator 180 cooperate to provide a lead-compensated digital integrator 182.

The digital integrator 146 includes the pulse decoder 92, the parallel adder 94, and the RAM 96. The lead compensator 180 includes the pulse decoder 92 and a parallel adder 184.

Operation of the lead-compensated digital integrator 182 is as follows: the phase detector 76 produces UP/DOWN signals (1,0, 0,1, or 1,1), the pulse decoder produces +1, −1, or 0 correction signals in accordance with the UP/DOWN signals. The parallel adder 94 sums the correction signals received from the pulse decoder 92, and the digital sums are stored in the RAM 96. These digitally-stored sums, or digitally-stored numbers are channelizing information which, when D/A converted, become channelizing voltages.

When a digitally-stored sum is recalled from the RAM 96, it is directed to the D/A converter 98 via the parallel adder 184 wherein lead compensation is added. In accordance with a digital number provided by the pulse decoder 92, the parallel adder 184 adds to, subtracts from, or leaves the same, the digitally-stored number received from the RAM 96, thereby adding lead compensation to channelizing information stored by, and recovered from, the RAM 96. Therefore, the voltage produced by the D/A converter 98 is a lead-compensated channelizing voltage.

Referring now to FIGS. 4, 6, and 7, significant differences in these embodiments reside in the lead compensators, 84, 148, and 180. The frequency-hopping oscillators, 72 of FIG. 4 and 136 of FIG. 6, add lead compensation by analog summation in the combiner/offsetter 108, of a channelizing voltage and a lead-compensation voltage. In contrast, the frequency-hopping oscillator 170 of FIG. 7 adds lead compensation by digital summation of digitized channelizing information and a digital lead-compensation signal in the parallel adder 184.

When frequency-correction information is developed to the point that the channelizing information will drive the output frequency to almost phase lock, it is proper to call it corrected channelizing information.

Frequency-correcting information may be a single sample provided by a phase comparison step, or it may be made up of successively-summed and stored frequency-correction information.

Generation of frequency-correcting information is via a learning path 220 of FIG. 4, a learning path 222 of FIG. 6, and a learning path 224 of FIG. 7. Each learning path, 220, 222, or 224 includes components of a system that function together to provide frequency-correction information, thereby providing an adaptive system that compensates for lack in precision in proportionality and/or linearity and temperature drift in components that include analog inputs or outputs.

The learning path 220 of FIG. 4 includes the phase detector 76, the decoder 92, the parallel adder 94, the RAM 96, the D/A converter 98, the low-pass filter 100, the combiner/offsetter 108, the VCO 20, and the feedback path 120.

The learning path 222 of FIG. 6 includes the phase detector 76, the decoder 92, the parallel adder 162, the RAM 160, the parallel adder 164, the D/A converter 98, the low-pass filter 100, the combiner/offsetter 108, the VCO 20, and the feedback path 120.

The learning path 224 of FIG. 7 includes the phase detector 76, the decoder 92, the parallel adder 94, the RAM 96, the parallel adder 184, the D/A converter 98, the low-pass filter 100, the combiner/offsetter 108, the VCO 20, and the feedback path 120.

Figure 8:
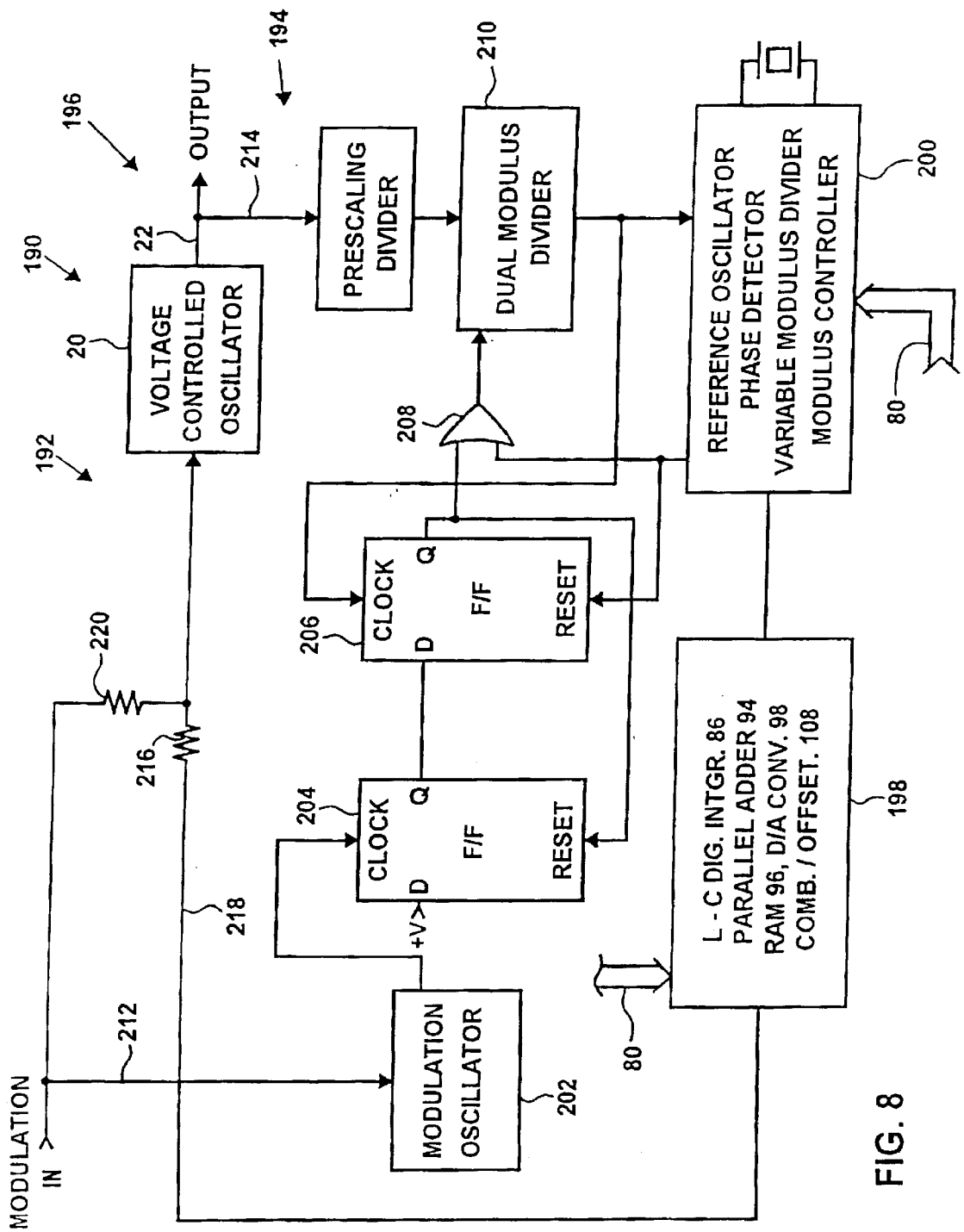
FIG. 8 is modification of a prior art patent, showing how AC and DC modulation may be added to the frequency-hopping oscillators of the present invention.

Referring now to FIG. 8, a frequency-hopping oscillator, or adaptive system, or learning system, 190 illustrates how the frequency-hopping oscillators and the lead-compensated digital integrators of the present invention can be combined with any of the DC modulated phase-locked oscillators of the aforesaid Lautzenhiser patents.

The frequency-hopping oscillator 190 incorporates components of FIG. 6 of Lautzenhiser, U.S. Pat. No. 5,091,706 which includes a detailed description of FIG. 6, said Lautzenhiser patent being incorporated herein by reference thereto.

Referring again to FIG. 8, the frequency-hopping oscillator 190 may AC and/or DC modulated. That is, both a forward path 192 and a feedback path 194 of a phase-locked oscillator 196 may be modulated by various means as taught in the aforesaid Lautzenhiser patents.

The frequency-hopping oscillator 190 of FIG. 8 includes a block 198 that represents components shown and described in conjunction with the frequency-hopping oscillator 72 of FIG. 4, as named and numbered in the block 198. That is, the block 198 represents inclusion of the lead-compensated digital integrator 86, the parallel adder 94, the RAM 96, the D/A converter 98, and the combiner/offsetter 108 in the forward path 192 of the frequency-hopping oscillator 190 of FIG. 8.

Attachment of the frequency-command conductors 80 to the RAM 96 of FIG. 4 is represented in FIG. 8 by connection of the frequency-command conductors 80 to the block 198; and connection of the frequency-command conductors 80 to the divider 78 of FIG. 4 is represented by connection of the frequency-command conductors 80 to a block 200 that contains components as named therein. Therefore, the forward path 192 is channelized as taught in conjunction with FIG. 4, and channelization of the feedback path 194 is achieved by the divider 78, as controlled by the frequency-command conductors, as taught in conjunction with FIG. 4.

Modulation of the feedback path 194 is accomplished by a modulation oscillator 202, a clock 204, another clock 206, an OR gate 208, and a dual modulus divider 210, in response to a modulation voltage being supplied to the modulation oscillator 202 via a modulation conductor 212, as taught in conjunction with FIG. 6 in the aforesaid Lautzenhiser patent. The dual modulus divider 210 is interposed into a feedback conductor 214.

Modulation of the forward path 192 is accomplished by interposing a summing resistor 216 into a forward path conductor 218, and supplying the modulation voltage of the modulation conductor 212 to the forward path conductor 218 is via a modulation resistor 220.

Figure 9:
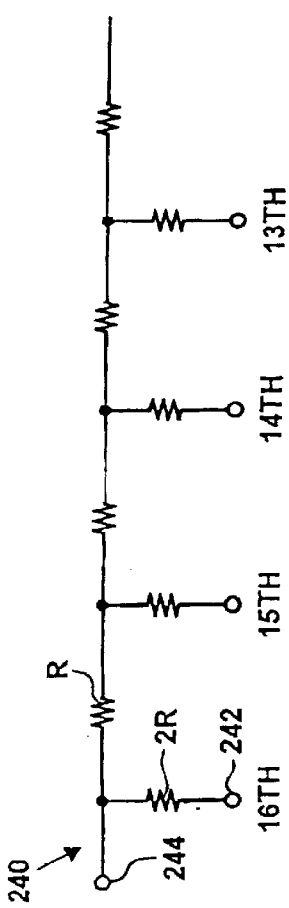
FIG. 9 is a schematic drawing of a conventional D/A converter that uses a ladder of R and 2R resistors.

Referring now to FIG. 9, a prior-art D/A converter 240 includes bits, or digital inputs, 242 for sixteen bits of binary-coded information, and an output voltage node 244.

The D/A converter 240 includes a plurality of resistors R and a plurality of resistors 2R. Each of the resistors R have equal resistances. In like manner, all of the resistors 2R have equal resistances, but their resistances are twice the values of the resistances of the resistors R.

Any combination of the digital inputs 242 may be connected selectively to 10.0 volts, or any other suitable voltage to represent a digital 242 of 1, or connected to ground to represent a digital input 242 of 0. The resultant voltage output at the node 244 will be a function of the digital inputs 242, as determined by connecting selective ones of the inputs 242 to 10.0 volts or ground.

For example, with 10.0 volts applied to sixteen digital inputs 242, that is with sixteen digital inputs 242 equal to a digital 1, the digital input will be 65,535 which is one less than 2.0 to the 16th power, and the theoretical voltage output will be (10×65,535)/65,536=9.999847.

Figure 10:
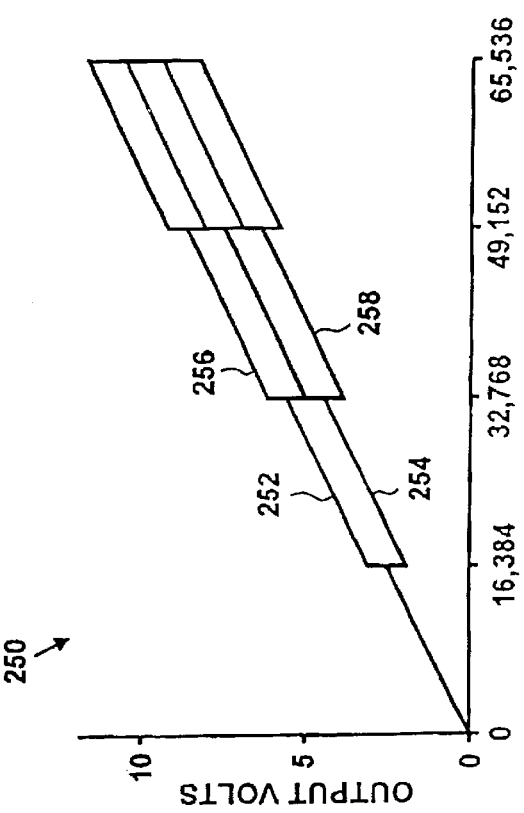
FIG. 10 is a diagram showing examples of variations in output voltages as caused by variations in resistances of the D/A converter of FIG. 9.

Referring now to FIG. 10, a voltage curve 250 illustrates some of the variations in output voltage versus digital input that commonly occur with the prior-art D/A converter 240 of FIG. 9.

While, in the discussion that follows, problems caused by error in resistances of the resistors 2R will be discussed, it should be apparent the errors in the resistors R will also be involved, since each pair of R and 2R resistors outputs a voltage to the next higher bit.

At a digital input of 16,383, the first fourteen bits, or digital inputs, 242 are at 1. But at a digital input of 16,384, a fifteenth digital input 242 of FIG. 9 is at 1 and the fourteen digital inputs 242 that were at 1 are now at 0. Therefore, errors in resistances in the fourteen resistors 2R of FIG. 9 that had inputted a digital 16,383 and whose errors in resistances may be accumulative either negatively or positively, are now connected to ground rather than to 10.0 volts, and a resistor 2R at the fifteenth bit 242 that represents a digital 16,384 is connected to 10.0 volts.

Referring now to FIGS. 9 and 10, the change from the accumulative error of the fourteen resistors 2R of FIG. 9 that were connected to 10.0 volts to an error in a single, or fifteenth, resistor 2R being connected to the 10.0 volts may result in the voltage curve 250 of FIG. 10 stepping vertically up to a curve 252, or stepping vertically down to a curve 254 in response to a change from 16,383 to 16,384 in a digital input 242.

As a second example, at a digital input of 32,767, fifteen digital inputs 242 of FIG. 9 are at 1. But at a digital input of 32,768, a sixteenth digital input 242 is at 1 and the fifteen inputs 242 that were at 1 are now at 0. Therefore, errors in resistances in fifteen of the resistors 2R of FIG. 9, that may be accumulative either negatively or positively, are now replaced by a single resistor 2R at the sixteenth bit 242.

This change from the accumulative error of the fifteen resistors 2R to an error in the single, or sixteenth, resistor 2R may result in the voltage curve 250 of FIG. 10 stepping vertically up to a curve 256, or stepping vertically down to a curve 258 in response to a change from 32,767 to 32,768 in a digital input.

Figure 11A:
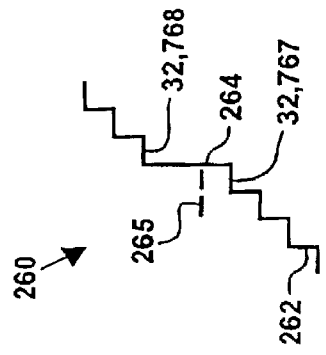
FIG. 11A is a diagram showing, in stepped form, showing that holes in output voltages of the D/A converter of FIG. 9 may be caused by variations in resistances of standard resistors.
Figure 11B:
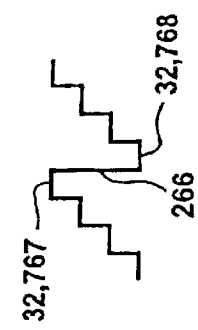
FIG. 11B is a diagram, similar to FIG. 11A, but showing in stepped form that variations in resistances of standard resistors may result in duplicate digital addresses.

Referring now to FIGS. 11A and 11B, these figures are included to teach the same truths as FIG. 10, but illustrate them differently. Rather than the voltage output of the prior-art D/A converter 240 being in the form of a smooth curve, as illustrated in FIG. 10, in actuality, an output voltage curve 260 of FIG. 11A steps upwardly in theoretically-equal steps 262 with each increase in a digital input.

As illustrated by the output voltage curve 260 of FIG. 11A, a sharp increase 264 in output voltage may occur when a digital input of 32,767 is increased to 32,768 and errors in fifteen resistors 2R are replaced by an error in a different resistor 2R of FIG. 9 at the sixteenth bit 242.

Therefore, in the illustration of FIG. 11A there is a hole between these two digital inputs in that the D/A converter 240 of FIG. 9 cannot produce a step 265, which is shown by a phantom line, between digital inputs of 32,767 and 32,768.

In like manner, as illustrated in FIG. 11B, a sharp decrease 266 in an output voltage curve 268 may occur when a digital input is changed from 32,767 to 32,768 and errors in fifteen resistors 2R are replaced by an error in a different resistor 2R at the sixteenth bit 242.

Referring now to FIG. 12A, an output voltage curve 270 of the prior-art D/A converter 240 of FIG. 9 shows how one or more holes may occur because of accumulative errors of the resistors 2R in lower bits, and replacement by a single resistor 2R in the next higher bit. In FIG. 12A the output voltage jumps from an output voltage 272 to an output voltage 274 with an upward step 275 in response to an increase in a digital input from 32,767 to 32,768.

Referring now to FIG. 12B, an output voltage curve 276 of the prior-art D/A converter 240 of FIG. 9 shows that accumulative errors in the resistors 2R may result in a downward step 281 from an output voltage 278 to an output voltage 280 with an increase in a digital input from 32,767 to 32,768.

Therefore, accumulative errors in the resistors 2R, instead of producing holes, may produce duplicate digital addresses, or dual addresses, 279A and 279B. A duplicate digital address refers to a phenomena in which a desired output voltage can be obtained by either of two different digital addresses.

As an example, in the output voltage curve 276, an output of 5.0 volts can be obtained by inputting a digital input of 32,668, or it can be obtained by inputting a digital input of 32,868. In like manner, various voltages can be outputted in response to either of two digital inputs, as can be seen by inspection of FIG. 12B.

Referring now to FIG. 13, a nonlinear D/A converter 282 of the present invention includes a plurality of the resistors R, three of which are labeled R16, R15, and R14 to identify them with their respective bits, and a plurality of the resistors 2R, three of which are labeled 2R16, 2R15, and 2R14 to identify them with their respective bits.

The resistors R are arranged as shown, with resistances of resistors 2R nominally being twice as large as resistances of resistors R, as described in conjunction with FIG. 9, a plurality of the digital inputs 242, and the output voltage node 244. However, in addition to resistors R and 2R, the nonlinear D/A converter 282 includes a plurality of resistors ΔR, three of which are labeled ΔR16, ΔR15, and ΔR14 to identify them with their respective bits.

For the sake of simplicity, for the discussion that follows, reference to resistors will be made without individual bit designation. That is, R, 2R, and ΔR will be used to refer to resistors for all bits.

This series arrangement of resistors 2R with ΔR illustrates the use, in an actual design, of resistors 2R with resistances, whether fixed or variable, that are greater than twice the resistance of the resistors R.

The effect of increasing the resistances of the resistors 2R, is to insert dual addresses, as shown in FIG. 12B, at each bit 242 wherein the resistances of the respective resistors 2R have been increased, thereby eliminating any possibility of holes.

As can be appreciated, as the number of bits 242 increase in response to increasing digital inputs 242, and the number of resistors 2R that are used to convert the digital number increases, accumulative errors in the resistors 2R can cause holes that more seriously effect D/A conversion.

Therefore, while it may not be necessary to use the resistors ΔR for all bits, a sufficient number must be included to prevent holes, or to avoid the expense of providing, or matching, the resistors precisely enough to prevent holes.

Ideally, each higher bit will produce a slightly smaller voltage than the sum of all smaller bits. Thus, it can be seen that resistances of each of the resistors ΔR will not necessarily be equal. And, since the resistances of the ΔR resistors merely symbolize increasing of resistances of the resistors 2R, it becomes apparent that resistances of the resistors 2R may not be equal.

Optionally, rather than increasing resistances of the resistors 2R, decreasing resistances of some, or all, of the resistors R will also produce a nonlinear D/A converter as taught herein. And, it becomes apparent that the resistances of all of the resistors R may not necessarily be equal. Instead, in accordance with individualized design criteria, resistances of all of the resistors, R and 2R, may be selected by a computer analysis.

Referring now to FIG. 14, the objective of prior art D/A converters has been to convert digital inputs, in binary form, to output voltages that increase linearly with an increase in the digital input, as illustrated by an output voltage curve 284. However, as shown and described above, it has been difficult to produce D/A converters that do not have holes, as illustrated in FIGS. 11A and 12A.

In contrast to prior art D/A converters in which output linearity has been the design criteria, the present invention provides a nonlinear D/A converter in which holes are eliminated, dual addresses are provided for one or more of the higher bits, manufacturing cost is minimized, and the number of bits can be increased beyond normal limitations without incurring holes or requiring ultra-precision resistors.

Referring now to FIG. 15, instead of producing an output 284 of FIG. 14 that is a straight line, as is the design goal of the prior art D/A converter of FIG. 9, the D/A converter 282 of FIG. 13 produces an output voltage curve 286 that slopes downwardly as digital inputs increase.

Further, in prior art D/A converters, the voltage steps 262 of FIG. 11A are designed to be equal. Thus, each higher bit produces twice the output voltage of the next lower bit. In contrast, in the present invention, for bits 242 of FIG. 13 wherein ΔR resistors are included, each higher bit produces an output voltage that is less than twice that of the next lower bit.

Finally, in prior art D/A converters, when a 1 at a higher bit replaces all 1's of all lower bits, the design objective is for a voltage output to increase by a step 262 of FIG. 11A. In contrast, in the present invention, the design objective is to produce a lower output voltage when a 1 for a higher bit replaces 1's for all lower bits.

In some applications, such as learning systems, including the frequency-hopping oscillators 72 of FIG. 4, 136 of FIG. 6, 170 of FIG. 7, and 190 of FIG. 8, the presence of holes in D/A converters 98 can cause the phase-locked oscillator 74, 152, 172, or 196 to "hunt." That is, at one digital input both the output voltage and the output frequency of the VCO 22 will be too low to phase lock, and at the very next higher digital input both an output voltage and an output frequency of the VCO 22 will be too high.

While the voltage output of the D/A converter 282 is intentionally nonlinear, it should be recognized that, in adaptive systems, such as the frequency-hopping oscillators 72, 136, 170, and 190, nonlinearity of components, such as the D/A converter 98 has no effect on the precision of the system. In contrast, holes in the voltage output can degrade preciseness of any adaptive system seriously and even result in malfunction.

The D/A converter 282 of FIG. 12 may be constructed with resistances of resistors R increased by resistances of resistors ΔR for all sixteen bits 242. If so, resistors that are less precise than those commonly used in 12-bit D/A converters, and therefore more economical, can be used.

Or, since it is not particularly difficult or expensive to build 12-bit A/D converters that do not contain holes, the present invention may be practiced by custom manufacturing 16-bit, or greater, A/D converters in which only the higher bits include resistances that are equal to resistors R plus ΔR.

Figure 16:
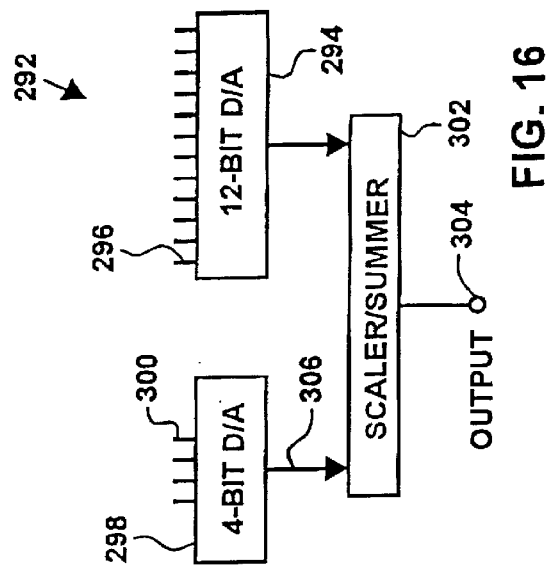
FIG. 16 is a block diagram of a second embodiment of the nonlinear D/A converter of the present invention.

Referring now to FIG. 16, a 16-bit D/A converter 292 includes a 12-bit D/A converter 294 with twelve lower bits, or twelve digital inputs, 296, a 4-bit D/A converter 298 with four higher bits, or four higher digital inputs, 300, an analog scaler/summer 302, and an output node 304.

First, assume that the 16-bit converter 292 is an ideal D/A converter 240 as described in conjunction with FIG. 9, and assume 65.536 volts as a digital 1 for the digital inputs, 296 and 300. Since there are 65,536 steps in a sixteen-bit D/A converter, each step would be 1.0 millivolt.

A maximum voltage output of the 12-bit D/A converter 294 occurs when all twelve digital inputs 296 are a digital 1. At this time, the digital input is 4,095. Therefore, the output voltage is 4,095 bits×1.0 millivolt per bit=4.095 volts.

When separate ones of the thirteenth, fourteenth, fifteenth, and sixteenth bits 300 are at a digital 1, the digital inputs are 4,096, 8,192, 16,384, and 32,768, respectively. Thus, it can be seen that each of the four higher digital inputs 300 doubles the voltage output.

It follows that, if the 12-bit D/A converter 294 produces less than 4.096 volts with all inputs at 1, there will be a hole when the digital input is increased by one, and a digital 1 at the thirteen bit 300 of the 4-bit D/A converter 298 replaces twelve bits 296 of the 12-bit D/A converter 294.

However, in the 16-bit D/A converter 292 of FIG. 16, an analog scaler/summer 302 is used to scale an output voltage in a conductor 304 of the 4-bit D/A converter 298 to any suitable value lower than 4.096 volts.

For instance, if the analog scaler/summer 302 decreases the steps produced by the 4-bit D/A converter 298 from 4.096 volts to 3.0 volts, as 3.0 volt increments are added to output voltages of the 12-bit D/A converter 294 that extend up to a maximum of approximately 4.095 volts, any possibility of holes in the four higher bits 300 is eliminated.

Instead of the possibility of any holes, there are duplicate digital addresses that will produce the same output voltages, similar to those shown and described in conjunction with FIG. 11B.

In the example above, to reach any output voltage between 3.0 and 4.095, the 4-bit D/A converter 298 can have an output of either 0.0 or 3.0 volts. If the output of the 4-bit D/A converter 298 is 0.0 volts, the output of the 12-bit D/A converter 294 will range from 0.0 to 4.095 volts, but if the output of the 4-bit D/A converter 298 is 3.0 volts, the output of the 12-bit D/A converter 294 will range from 0.0 to 1.095 volts.

Referring now to FIGS. 13 and 16, in the D/A converters 282 and 292 holes are eliminated by intentionally providing dual digital addresses that are of sufficient size that resistor tolerances cannot eliminate them.

Referring again to FIG. 12B, dual digital addresses are provided by scaling an output voltage of one higher bit, 242 or 300, smaller than a voltage output when all lower bits, 242 or 296, are at a digital 1.

In the D/A converter 292 some of the higher bits 300 are scaled before summing with output voltages of the lower bits 296. Alternately, rather than changing resistances of resistors R and/or 2R, input voltages to some of the higher bits 242 can be scaled.

It follows that, even if low quality resistors are used, if voltage outputs are scaled as the number of the bit increases, as taught herein, D/A converters can be constructed with any desired number of bits without any danger of holes existing in output voltages.

Any-adaptive system, any learning system, or any adaptive leaning system that utilizes a D/A converter, can practice the present invention by scaling output voltages for some of the higher bits, or all of the bits, by any of the means taught herein.

In summary, apparatus and method are provided for adaptively producing channelizing information. Error signals, or UP/DOWN signals, that are generated by the phase detector 76, which always include both an UP and a DOWN signal, and which represent one of three different states (1,0, 0,1, or 1,1), are decoded by the decoder 92 into correction signals.

The correction signals, any one of which may be either plus one, minus one, or zero (+1, −1, or 0), are digitally integrated by a process that includes digitally storing information in a RAM, 96 or 160, recalling the digitally-stored information from the RAM, 96 or 160, parallel adding a (+1, a −1, or a 0) in the parallel adder, 94 or 164, as a correction signal, or as correction information, storing the algebraic sum in the RAM, 96 or 160, and repeating the recalling, correcting, and storing steps at a clock frequency that is preferably the reference frequency of the reference oscillator 12.

Lead compensators, 84, 148, or 180 are provided for the digital integrators, 82 and 146. Lead compensation is achieved by a decoder, 92, 110, or 138, that changes UP/DOWN signals (1,0, 0,1, or 1,1) that are generated by the phase detector 76 into lead compensation signals (+L, −L, or 0), as shown in FIG. 4. The lead compensation signals are combined with the digital channeling information by D/A converters, 98 and 112, and by an analog combiner/offsetter 108, as shown in FIGS. 4 and 6. Alternately, the lead compensation signals are combined with the digital channeling information by the parallel adder 184, as shown in FIG. 7.

The D/A converters 282 and 292 of the present invention can be characterized by method steps as: preventing holes; providing dual addressees; making a voltage output of one bit less than twice the next lower bit; making a voltage output of a higher bit greater than the sum of all smaller bits; making an output voltage nonlinear; and making an output voltage lower than a straight-line proportion to digital inputs.

In summary, the present invention provides not only improved phase-locked oscillators, improved frequency-hopping oscillators, lead-compensated digital integrators, and an improved D/A converter in which holes are eliminated, but also adaptive phase-locked oscillators and adaptive frequency-hopping oscillators with lead-compensated digital integrators and D/A converters that are free from holes.

Lead compensators, 84, 148, or 180 are provided for the digital integrators, 82 and 146. Lead compensation is achieved by a decoder, 92, 110, or 138, that changes UP/DOWN signals (1,0, 0,1, or 1,1) that are generated by the phase detector 76 into lead-compensation signals (+L, −L, or 0), as shown in FIG. 4. The lead-compensation signals are combined with the digital channeling information by D/A converters, 98 and 112, and by an analog combiner/offsetter 108, as shown in FIGS. 4 and 6. Alternately, the lead-compensation signals are combined with the digital channeling information by the parallel adder 184, as shown in FIG. 7.

What is claimed is:

1. A method for adaptively producing information for a plurality of channelized frequencies comprises:
    a) recalling from a memory correction information for one of said channelized frequencies;
    b) adaptively correcting said recalled correction information;
    c) storing said corrected correction information; and
    d) repeating said steps of a) recalling, b) adaptively correcting, and c) storing to update said correction information of said one of said channelized frequencies prior to a step of recalling correction information for an other of said channelized frequencies.

2. A method as claimed in claim 1 in which said adaptive correcting step comprises parallel adding.

3. A method as claimed in claim 1 in which said adaptive correcting steps comprise algebraically adding a plus one, a minus one, or a zero.

4. A method as claimed in claim 1 in which said adaptive correcting step comprises:
    a) phase comparing; and
    b) generating UP/DOWN signals as a function of said comparing step.

5. A method as claimed in claim 1 in which said adaptive correcting step comprises:
    a) phase comparing;
    b) generating UP/DOWN signals as a function of said comparing step; and
    c) algebraically adding a plus one, a minus one, or a zero to said recalled digital information as a function of said UP/DOWN signals.

6. A method as claimed in claim 1 in which said adaptive correcting step comprises:
    a) driving an output frequency toward phase lock with a reference frequency for said one channel in response to said recalled digital information;
    b) comparing said output frequency with a reference frequency;
    c) generating UP/DOWN signals as a function of said comparing step; and
    d) correcting said recalled digital information as a function of said UP/DOWN signals.

7. A method as claimed in claim 1 in which said adaptive correcting step comprises:
    a) driving an output frequency toward phase lock with a reference frequency for said one channel in response to said recalled digital information;
    b) comparing said output frequency with a reference frequency;
    c) generating UP/DOWN signals as a function of said comparing step; and
    d) algebraically adding a plus one, a minus one, or a zero to said recalled digital information as a function of said UP/DOWN signals.

8. A method as claimed in claim 1 in which said recalling step comprises recalling digital information that is volatile, and said method further comprises;
   a) recalling prestored digital information that is nonvolatile;
   b) combining said recalled digital information, volatile and nonvolatile;
   c) driving an output frequency toward phase lock for said one channelized frequency in response to said combining step.

9. A method as claimed in claim 1 in which:
   a) said adaptive correcting step comprises D/A converting;
   b) said D/A converting step comprises producing a plurality of dual addresses wherein two different binary-coded inputs produce the same output voltage; and
   c) said D/A converting step further comprises preventing manufacturing tolerances from obliterating any of said dual addresses.

10. A method as claimed in claim 1 in which:
   a) said adaptive correcting step comprises D/A converting;
   b) said D/A converting step comprises making an analog output of a plurality of higher bits less than twice an analog output of the next lower bit; and
   c) said D/A converting step further comprises preventing manufacturing tolerances from obliterating said less than twice relationship at any of said higher bits.

11. A method as claimed in claim 1 in which said adaptive correcting step comprises:
   a) driving an output frequency toward phase lock with a reference frequency for said one channelized frequency in response to said recalled digital information; and
   b) said method further comprises lead compensating said driving step.

12. A method as claimed in claim 1 in which said adaptive correcting-step comprises generating UP/DOWN signals, and said method further comprises:
   a) decoding lead-compensation information from said UP/DOWN signals; and
   b) driving an output frequency toward phase lock for said one channelized frequency as a combined response to said UP/DOWN signals and said lead-compensation information.

13. A method as claimed in claim 1 which:
   a) said adaptive correcting step comprises phase comparing at a compare frequency; and
   said repeating step comprises repeating said recalling and storing steps at a frequency that is higher than said comparing step.

14. A method for adaptively producing information for a plurality of channelized output frequencies, which method comprises:
   a) selecting phase-locking parameter values for one of said channelized frequencies;
   b) producing UP/DOWN signals indicative of phase-locking conditions;
   c) digitally integrating a phase difference signal corresponding to said UP/DOWN signals at a clock frequency; and
   d) said digital integrating step comprises recalling and digitally storing at said clock frequency.

15. A method as claimed in claim 14 in which said digital integrating step further comprises parallel adding intermediate of said recalling and digital storing steps.

16. A method as claimed in claim 14 in which said digital integrating step comprises:
   a) producing plus one, minus one, and zero correction signals as a function of said UP/DOWN signals; and
   b) parallel adding successive ones of said correction signals intermediate of said recalling and digital storing steps.

17. A method as claimed in claim 14 in which said method further comprises:
   a) decoding lead-compensation information from said UP/DOWN signals; and
   b) driving an output frequency toward phase lock for said one channelized frequency as a combined response to said integrated phase difference signal and said lead-compensating information.

18. A method as claimed in claim 14 in which said method further comprises:
   a) decoding lead-compensation information from said UP/DOWN signals;
   b) combining said lead-compensation information with said digitally-integrated phase difference signal; and
   c) driving an output frequency toward phase lock for said one channelized frequency in response to said combining step.

19. A method as claimed in claim 14 in which said method further comprises:
   a) decoding lead-compensation information from said UP/DOWN signals;
   b) digitally combining said lead-compensation information with said digitally-integrated phase difference signal;
   c) D/A converting subsequent to said digital combining step; and
   d) driving an output frequency toward phase lock for said one channelized frequency in response to said D/A converting step.

20. A method as claimed in claim 14 in which said method further comprises:
   a) decoding lead-compensation information from said UP/DOWN signals;
   b) parallel adding said lead-compensation information to said digitally-integrated phase difference signal;
   c) D/A converting subsequent to said parallel adding step; and
   d) driving an output frequency toward phase lock for said one channelized frequency in response to said D/A converting step.

21. A method as claimed in claim 14 in which said method further comprises:
   a) decoding lead-compensation information from said UP/DOWN signals;
   b) D/A converting said lead-compensation information;
   c) D/A converting said digitally-integrated phase difference signal;
   d) analog combining as a function of said D/A converting steps; and
   e) driving an output frequency toward phase lock for said one channelized frequency in response to said analog combining step.

22. A method as claimed in claim 14 in which said recalling step comprises recalling digital information that is volatile, and said method further comprises:

a) recalling prestored digital information that is nonvolatile;
b) combining said recalled digital information, volatile and nonvolatile;
c) driving an output frequency toward phase lock for said one channelized frequency in response to said combining step.

23. A method as claimed in claim 14 in which:
a) said method comprises D/A converting;
b) said D/A converting step comprises producing a plurality of dual addresses wherein two different binary-coded inputs produce the same output voltage; and
c) said D/A converting step further comprises preventing manufacturing tolerances from obliterating any of said dual addresses.

24. A method as claimed in claim 14 in which:
a) said method comprises D/A converting;
b) said D/A converting step comprises making an analog output of a plurality of higher bits less than twice an analog output of the next lower bit; and
c) said D/A converting step further comprises preventing manufacturing tolerances from obliterating said less than twice relationship at any of said higher bits.

25. A method as claimed in claim 14 in which:
a) said producing step comprises phase comparing at a compare frequency; and
b) said clock frequency is greater than said compare frequency.

26. A method for adaptively producing information for a plurality of channelized output frequencies comprises:
a) selecting phase-locking parameter values for one of said channelized frequencies;
b) producing UP/DOWN signals indicative of phase locking conditions;
c) accumulatively-summing a correction signal as a function of said UP/DOWN signals; and
d) said accumulatively-summing step comprises repeatedly recalling, updating, and storing said correction signal at a clock frequency.

27. A method as claimed in claim 26 in which said accumulatively summing step comprises parallel adding intermediate of said recalling and digital storing steps.

28. A method as claimed in claim 26 in which said accumulatively summing step comprises:
a) producing plus one, minus one, and zero correction signals as a function of said UP/DOWN signals; and
b) parallel adding said plus one, minus one, and zero correction signals intermediate of said recalling and digital storing steps.

29. A method as claimed in claim 26 in which said method further comprises:
a) decoding lead-compensation information from said UP/DOWN signals; and
b) driving an output frequency toward phase lock for said one channelized frequency as a combined response to said accumulatively-summed signals and said lead-compensating information.

30. A method as claimed in claim 26 in which said method further comprises:
a) decoding lead-compensation information from said UP/DOWN signals;
b) combining said lead-compensation information with said accumulatively-summed signals; and
c) driving an output frequency toward phase lock for said one channelized frequency in response to said combining step.

31. A method as claimed in claim 26 in which said method further comprises:
a) decoding lead-compensation information from said UP/DOWN signals;
b) digitally combining said lead-compensation information with said accumulatively-summed signals;
c) D/A converting subsequent to said digital combining step; and
d) driving an output frequency toward phase lock for said one channelized frequency in response to said D/A converting step.

32. A method as claimed in claim 26 in which said method further comprises:
a) decoding lead-compensation information from said UP/DOWN signals;
b) parallel adding said lead-compensation information to said accumulatively-summed signals;
c) d/A converting subsequent to said parallel adding step; and
d) driving an output frequency toward phase lock for said one channelized frequency in response to said D/A converting step.

33. A method as claimed in claim 26 in which said method further comprises:
a) decoding lead-compensation information from said UP/DOWN signals;
b) D/A converting said lead-compensation information;
c) D/A converting said accumulatively-summed signals;
d) analog combining as a function of said D/A converting steps; and
e) driving an output frequency toward phase lock for said one channelized frequency in response to said analog combining step.

34. A method as claimed in claim 26 in which said recalling step comprises recalling digital information that is volatile, and said method further comprises:
a) recalling prestored digital information that is nonvolatile;
b) combining said recalled digital information, volatile and nonvolatile;
c) driving an output frequency toward phase lock for said one channelized frequency in response to said combining step.

35. A method as claimed in claim 26 in which:
a) said method comprises D/A converting;
b) said D/A converting step comprises producing a plurality of dual addresses wherein two different binary-coded inputs produce the same output voltage; and
c) said D/A converting step further comprises preventing manufacturing tolerances from obliterating any of said dual addresses.

36. A method as claimed in claim 26 in which:
a) said method comprises D/A converting;
b) said D/A converting step comprises making an analog output of a plurality of higher bits less than twice an analog output of the next lower bit; and
c) said D/A converting step further comprises preventing manufacturing tolerances from obliterating said less than twice relationship at any of said higher bits.

37. A method as claimed in claim 26 in which:
a) said producing step comprises phase comparing at a compare frequency; and
b) said clock frequency is greater than said compare frequency.

38. Apparatus for adaptively producing information for a plurality of channelized output frequencies comprises a phase-locked oscillator having a phase detector, having a forward path that is operatively connected to said phase detector, and having both an integrator and a voltage-controlled oscillator in said forward path, the improvement in which said integrator comprises:
a digital storage device having a correction value stored therein;
a parallel adder being operatively connected to said digital storage device; and
means, comprising said digital storage device and said parallel adder, for recalling said correction value and updating said recalled correction value by adding thereto a correction signal of plus one, minus one, or zero, said correction value being repeatedly updated at a clock frequency.

39. Apparatus as claimed in claim 38 in which said digital storage device comprises a RAM.

40. Apparatus as claimed in claim 38 in which said apparatus further comprises:
an other digital storage device; and
an other parallel adder being operatively interposed into said forward path, and being operatively connected to both of said digital storage devices.

41. Apparatus as claimed in claim 38 in which said digital storage device comprises a RAM, and said apparatus further comprises:
a PROM; and
a second parallel adder being operatively interposed into said forward path, and operatively interconnecting said PROM and said RAM.

42. Apparatus as claimed in claim 38 in which said apparatus includes means, being interposed between said phase detector and said voltage-controlled oscillator, for developing said correction signals.

43. Apparatus as claimed in claim 38 in which said apparatus includes means, being interposed between said phase detector and said voltage-controlled oscillator, for lead compensating an output frequency of said voltage-controlled oscillator.

44. Apparatus as claimed in claim 38 in which said apparatus includes:
means, being interposed between said phase detector and said voltage-controlled oscillator, for developing said correction signals; and
means, being interposed between said phase detector and said voltage-controlled oscillator, for lead compensating an output frequency of said voltage-controlled oscillator.

45. Apparatus as claimed in claim 38 in which:
said means for algebraically summing comprises means for recalling and storing said algebraically-summed correction signals at said clock frequency;
said apparatus comprises means for providing a lead-compensating signal; and
said apparatus further comprises means for applying both said algebraically-summed correction signals and said lead-compensation signal to said voltage-controlled oscillator.

46. Apparatus as claimed in claim 38 in which:
said means for algebraically summing comprises means for recalling and storing said algebraically-summed correction signals at said clock frequency;
said apparatus comprises means for providing a lead-compensating signal; and
said apparatus further comprises means for analog combining said algebraically-summed correction signals and said lead-compensation signal.

47. Apparatus as claimed in claim 38 in which:
said means for algebraically summing comprises means for recalling and storing said algebraically-summed correction signals at said clock frequency;
said apparatus comprises means for providing a lead-compensating signal; and
said apparatus further comprises means for digitally combining said algebraically-summed correction signals and said lead-compensation signal.

48. Apparatus as claimed in claim 38 in which:
said apparatus further comprises a D/A converter being interposed in said forward path intermediate of said digital storage device and said voltage-controlled oscillator; and
said D/A converter comprises means for producing dual addresses for a plurality of analog outputs irrespective of variations in analog components.

49. Apparatus as claimed in claim 38 in which:
said apparatus further comprises a D/A converter interposed in said forward path intermediate of said digital storage device; and
said D/A converter comprises mean for making analog outputs for a plurality of larger bits less than twice as large as analog outputs of the next respective smaller bit irrespective of variations in analog components.

50. Apparatus for adaptively producing information for a plurality of channelized output frequencies comprises a phase-locked oscillator having an integrator in a forward path, the improvement in which said integrator comprises:
means for algebraically-summing a correction value with a correction signal of plus one, minus one, or zero to update the correction value, said means for algebraically-summing further summing the updated correction value with a successive correction signal to generate a successive updated correction value, and operating at a clock frequency; and
said means for algebraically-summing comprises means for storing and recalling algebraically-summed correction values at said clock frequency.

51. Apparatus as claimed in claim 50 in which said apparatus further comprises:
means for storing and recalling nonvolatile digital information; and
means for combining said recalled nonvolatile digital information and algebraically-summed correction values.

52. Apparatus as claimed in claim 50 in which said means for algebraically-summing comprises a parallel adder.

53. Apparatus as claimed in claim 50 in which said means for repeatedly storing and recalling comprises a RAM.

54. Apparatus as claimed in claim 50 in which said means for algebraically-summing comprises a decoder.

55. Apparatus as claimed in claim 50 in which:
said apparatus further comprises a reference oscillator that provides a reference frequency; and said means for algebraically-summing at said clock frequency comprises a RAM, a parallel adder, and a sampling-rate conductor that operatively connects said reference oscillator and said RAM.

56. Apparatus as claimed in claim 50 in which said apparatus further comprises:

a voltage-controlled oscillator being interposed into said forward path; and means, being interposed intermediate of said phase detector and said voltage-controlled oscillator, for lead compensating an output frequency of said voltage-controlled oscillator.

57. Apparatus as claimed in claim 50 in which said apparatus further comprises:

a voltage-controlled oscillator being interposed into said forward path;

means for providing a lead-compensating signal; and means for applying both algebraically-summed correction values and said lead-compensation signal to said voltage-controlled oscillator.

58. Apparatus as claimed in claim 50 in which said apparatus further comprises:

means for providing a lead-compensating signal; and means for combining algebraically-summed correction values and said lead-compensation signal.

59. Apparatus as claimed in claim 50 in which said apparatus further comprises:

means for providing a lead-compensating signal; and means, comprising a parallel adder, for digitally combining algebraically-summed correction values and said lead-compensation signal.

60. Apparatus as claimed in claim 50 in which:

said apparatus further comprises a D/A converter that is operatively connected to said means for algebraically summing; and said D/A converter comprises means for producing dual addresses for a plurality of analog outputs irrespective of variations in analog components.

61. Apparatus as claimed in claim 50 in which:

said apparatus further comprises a D/A converter that is operatively connected to said means for algebraically summing; and said D/A converter comprises means for making analog outputs for a plurality of larger bits less than twice as large as analog outputs of the next respective smaller bit irrespective of variations in analog components.

62. Apparatus for adaptively producing information for a plurality of channelized output frequencies comprises a phase-locked oscillator having a phase comparator that produces UP/DOWN signals indicative of phase-locking conditions, and having a forward path with a voltage-controlled oscillator that produces an output frequency, the improvement which comprises:

means, being interposed intermediate of said phase detector and said voltage-controlled oscillator, for recalling and storing digital information, including correction information, at a clock frequency; and means for progressively updating said correction information by adding successive ones of a plus one, a minus one, or a zero to said correction information in accordance with said UP/DOWN signals.

63. Apparatus for adaptively producing information for a plurality of channelized output frequencies comprises a phase-locked oscillator having a phase comparator, and having a forward path with a voltage-controlled oscillator that produces an output frequency, the improvement which comprises:

a digital storage device being intermediate of said phase comparator and said forward path; and a parallel adder being intermediate of said comparator and said forward path, and being connected to said digital storage device; and a clock, being connected to said digital storage device.

64. A method for adaptively producing information for a plurality of channelized frequencies comprises:

a) recalling from a memory correction information for one of said channelized frequencies;

b) adaptively correcting said recalled correction information;

c) storing to said memory said corrected correction information; and d) repeating said step of a) recalling, b) adaptively correcting, and c) storing at a clock frequency whereby said correction information is successively updated with each iteration.

65. A method for adaptively producing information for a plurality of channelized output frequencies, which method comprises:

a) recalling previously-stored information for one of said channelized frequencies;

b) driving an output frequency toward phase lock for said one channelized frequency;

c) producing UP/DOWN signals indicative of phase-locking conditions;

d) digitally integrating a phase difference signal corresponding to said UP/DOWN signals; and e) said digital integrating step comprises repeatedly recalling and storing prior to a step of recalling information for an other of said channelized frequencies.

66. A method for adaptively producing information for a plurality of channelized output frequencies comprises:

a) selecting phase-locking parameter values for one of said channelized frequencies;

b) recalling from a memory correction information for said one channelized frequency;

c) driving an output frequency toward phase lock for said one channelized frequency;

d) algebraically adding said correction information with a correction signal as a function of phase locking conditions to update said correction information and storing in said memory said updated correction information; and e) repeating the steps of recalling, algebraically adding and storing to accumulatively update said correction information with successive ones of said correction signals prior to recalling information for an other one of said channelized frequencies.

67. Apparatus for adaptively producing information for a plurality of channelized frequencies comprises a phase-locked oscillator, the improvement which comprises:

means for recalling information for one of said channelized frequencies;

means for adaptively correcting said recalled information for said one channelized frequency;

means for storing said adaptively-corrected information, whereby said adaptively-corrected information replaces said recalled information; and means for repeating said recalling, adaptively correcting, and storing prior to a step of recalling information for an other of said channelized frequencies, and wherein said adaptively corrected information takes the place of said recalled information in each successive iteration of the repeating means.

* * * * *